(12) United States Patent
Hino et al.

(10) Patent No.: US 12,131,906 B2
(45) Date of Patent: Oct. 29, 2024

(54) METHOD FOR FABRICATING SILICON CARBIDE SEMICONDUCTOR DEVICE AND POWER CONVERSION DEVICE USING THE SILICON CARBIDE SEMICONDUCTOR DEVICE

(71) Applicant: Mitsubishi Electric Corporation, Tokyo (JP)

(72) Inventors: Shiro Hino, Tokyo (JP); Koji Sadamatsu, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 218 days.

(21) Appl. No.: 17/789,795

(22) PCT Filed: Feb. 13, 2020

(86) PCT No.: PCT/JP2020/005461
§ 371 (c)(1),
(2) Date: Jun. 29, 2022

(87) PCT Pub. No.: WO2021/161436
PCT Pub. Date: Aug. 19, 2021

(65) Prior Publication Data
US 2023/0036221 A1 Feb. 2, 2023

(51) Int. Cl.
*H01L 21/04* (2006.01)
*H01L 29/16* (2006.01)
(Continued)

(52) U.S. Cl.
CPC ........ *H01L 21/045* (2013.01); *H01L 21/0485* (2013.01); *H01L 29/1608* (2013.01);
(Continued)

(58) Field of Classification Search
CPC .............. H01L 21/045; H01L 21/0485; H01L 29/1608; H01L 29/45; H01L 29/66068;
(Continued)

(56) References Cited

U.S. PATENT DOCUMENTS

| 2014/0084359 A1 | 3/2014 | Tsuchiya et al. |
| 2014/0231827 A1 | 8/2014 | Watanabe et al. |

(Continued)

FOREIGN PATENT DOCUMENTS

| JP | 2009-59993 A | 3/2009 |
| JP | 2014-67754 A | 4/2014 |

(Continued)

OTHER PUBLICATIONS

International Search Report and Written Opinion mailed on May 19, 2020, received for PCT Application PCT/JP2020/005461, filed on Feb. 13, 2020, 11 pages including English Translation.

*Primary Examiner* — Rafael O Leon De Domenech
(74) *Attorney, Agent, or Firm* — XSENSUS LLP

(57) ABSTRACT

The fabrication method for a silicon carbide semiconductor device according to this disclosure includes a step of forming a dielectric film over part of a silicon carbide layer, a step of forming an ohmic electrode adjoining the dielectric film on the silicon carbide layer, a step of removing an oxidized layer on the ohmic electrode, a step of forming a mask with its opening on the side opposite to the side where the ohmic electrode is adjoining the dielectric film on the ohmic electrode having the oxidized layer removed and on the dielectric film, and a step of wet etching of a film to be etched with hydrofluoric acid with the mask formed. With (Continued)

the fabrication method for a silicon carbide semiconductor device described in this disclosure, it is possible to fabricate a silicon carbide semiconductor device with reduced failure.

20 Claims, 30 Drawing Sheets

(51) Int. Cl.
*H01L 29/45* (2006.01)
*H01L 29/66* (2006.01)
*H01L 29/78* (2006.01)
*H02M 1/08* (2006.01)
*H02M 7/5387* (2007.01)
*H02P 27/08* (2006.01)

(52) U.S. Cl.
CPC ........ *H01L 29/45* (2013.01); *H01L 29/66068* (2013.01); *H01L 29/7806* (2013.01); *H02M 1/08* (2013.01); *H02M 7/53871* (2013.01); *H02P 27/08* (2013.01)

(58) Field of Classification Search
CPC .. H01L 29/7806; H02M 1/08; H02M 7/53871
See application file for complete search history.

(56) References Cited

U.S. PATENT DOCUMENTS

| | | | |
|---|---|---|---|
| 2015/0270353 | A1 | 9/2015 | Shimizu et al. |
| 2016/0197149 | A1* | 7/2016 | Sakai ................. H01L 29/0657 257/77 |
| 2017/0236935 | A1 | 8/2017 | Ebihara et al. |
| 2019/0057873 | A1 | 2/2019 | Sugahara et al. |
| 2019/0181229 | A1 | 6/2019 | Okumura |
| 2019/0371936 | A1* | 12/2019 | Nagahisa ............ H01L 29/7806 |

FOREIGN PATENT DOCUMENTS

| | | |
|---|---|---|
| JP | 2014-157896 A | 8/2014 |
| JP | 2015-185617 A | 10/2015 |
| JP | 2019-106425 A | 6/2019 |
| WO | 2016/052261 A1 | 4/2016 |
| WO | 2017/169086 A1 | 10/2017 |

\* cited by examiner

METHOD FOR FABRICATING SILICON CARBIDE SEMICONDUCTOR DEVICE AND POWER CONVERSION DEVICE USING THE SILICON CARBIDE SEMICONDUCTOR DEVICE

CROSS-REFERENCE TO RELATED APPLICATION

The present application is based on PCT filing PCT/JP2020/005461, filed Feb. 13, 2020, the entire contents of which is incorporated herein by reference.

TECHNICAL FIELD

This disclosure relates to a fabrication method for a silicon carbide semiconductor device made of silicon carbide and a fabrication method for a power conversion device including the silicon carbide semiconductor device.

BACKGROUND ART

A silicon carbide semiconductor device that is capable of preventing bipolar current from flowing through a parasitic pn diode of an insulated-gate field-effect transistor (MOSFET: Metal-Oxide-Semiconductor Field-Effect-Transistor) made of silicon carbide (SiC) in case of current flowing back by having a built-in Schottky Barrier Diode (SBD) is known.

There is a known SiC-MOSFET with a built-in SBD which has a Schottky contact and an ohmic contact formed in the same contact hole. To fabricate this structure, first, an ohmic electrode for the ohmic contact is formed with the region for the Schottky contact to be formed covered by a passivation film. Then, after the ohmic electrode is formed, a Schottky electrode is formed on the side where the passivation film has been removed with hydrofluoric acid to form the Schottky contact (for example, Patent Document 1).

[Patent Document 1] Japanese Unexamined Patent Publication No. 2014-157896

SUMMARY OF THE INVENTION

Problems to be Solved by the Invention

In the fabrication process of the SiC-MOSFET with a built-in SBD, in some cases where the passivation film is etched with the hydrofluoric acid, the passivation film adjoining the ohmic electrode is etched, with the ohmic electrode covered by a resist mask or the like. If the surface of the ohmic electrode is oxidized, in some cases when the passivation film is wet etched with the hydrofluoric acid, the hydrofluoric acid erodes the interface between the ohmic electrode and the resist mask. In such cases, there is a chance of etching proceeding up to an unexpected area such as a gate-dielectric film near a gate electrode in the MOSFET. This may cause fabrication failure such as defects in the gate-dielectric film and isolation failure of the gate-dielectric film.

This occurs not only in the fabrication of an SiC-MOSFET with a built-in SBD but also occurs in the fabrication of a general silicon carbide semiconductor device. In the process of wet etching of the dielectric film next to the ohmic electrode using the etchant solution containing the hydrofluoric acid with the resist mask formed on the ohmic electrode, the erosion of the interface between the ohmic electrode and the resist mask by the hydrofluoric acid may sometimes cause the etching to reach an unexpected area.

The object of this disclosure is to solve the above problem, to prevent the etching of an unexpected part with the hydrofluoric acid, and to provide a fabrication method of providing a silicon carbide semiconductor device with reduced failure.

Solutions

The fabrication method for a silicon carbide semiconductor device according to this disclosure includes a step of forming a dielectric film over part of a silicon carbide layer, a step of forming an ohmic electrode adjoining the dielectric film on the silicon carbide layer, a step of removing an oxidized layer on the ohmic electrode, a step of forming a resist mask with its opening on the side opposite to the side where the ohmic electrode is adjoining the dielectric film on the ohmic electrode having the oxidized layer removed and on the dielectric film, a step of wet etching of a film to be etched with hydrofluoric acid with the resist mask formed, and a step of removing the resist mask after the wet etching of the film.

Effects of the Invention

By the fabrication method for a silicon carbide semiconductor device according to this disclosure, the silicon carbide semiconductor device with reduced failure can be fabricated.

BRIEF DESCRIPTIONS OF THE DRAWINGS

EMBODIMENTS OF THE INVENTION

Hereinafter, Embodiments will be described with reference to the attached drawings. The drawings are schematical, which means the mutual relations between the sizes and the positions of the images shown in different drawings are not always accurate. They may be changed as appropriate. In the following descriptions, the same components are illustrated with the same sign, and their name and the function are also the same. Accordingly, their detailed descriptions may be omitted.

Embodiment 1

First, the configuration of a silicon carbide semiconductor device fabricated by a fabrication method according to Embodiment 1 of this disclosure will be described.

Figure 1:
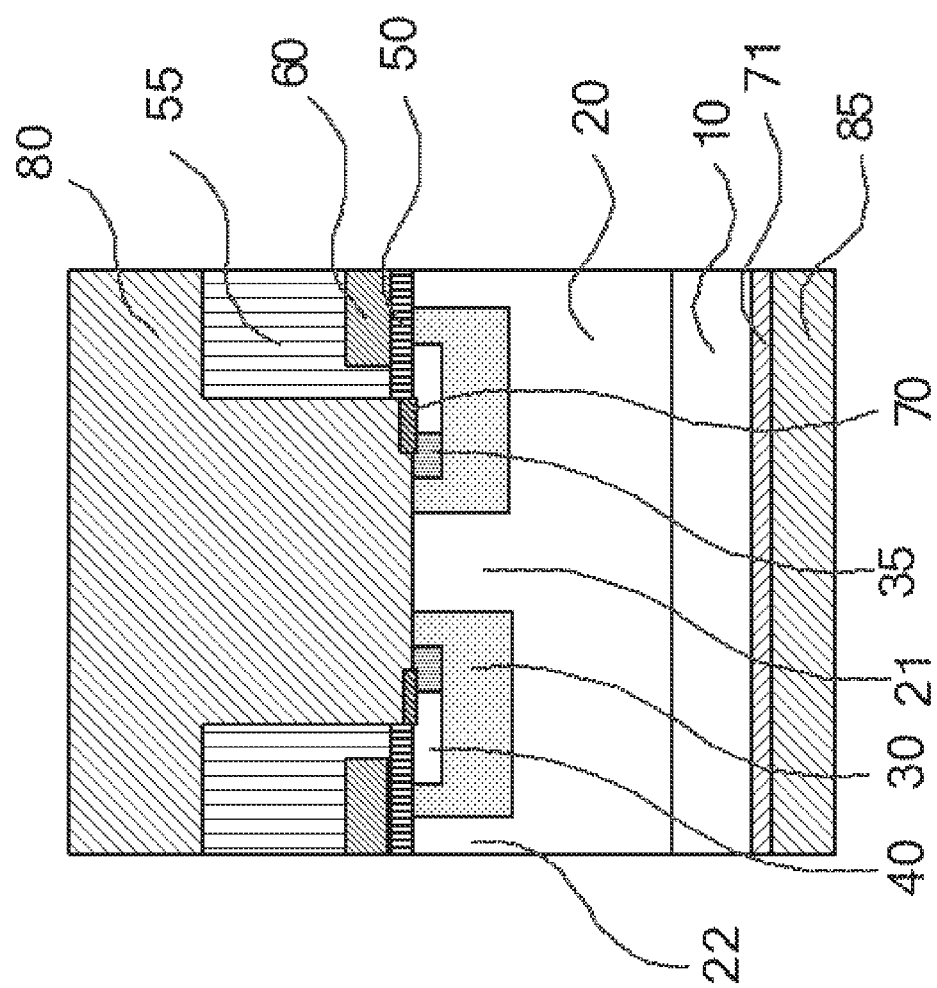
FIG. 1 is cross-sectional diagram of a silicon carbide semiconductor device fabricated by a fabrication method for a silicon carbide semiconductor device according to Embodiment 1.

FIG. 1 is cross-sectional diagram of a unit cell of an active region of a silicon carbide MOSFET with a built-in Schottky barrier diode (SiC-MOSFET with a built-in SBD), which is the silicon carbide semiconductor device fabricated by the fabrication method according to Embodiment 1.

In FIG. 1, a drift layer 20 made of n-type silicon carbide is formed on the surface of a semiconductor substrate 10 made of n-type low-resistance silicon carbide. A pair of well regions 30, the regions being separated from each other in the cross-sectional diagram, made of p-type silicon carbide is provided near the surface of the drift layer 20. A region between the paired well regions 30 is a first separation region 21, which is a part of the drift layer 20.

Second separation regions 22, which are part of the drift layer 20, are provided on the outer sides of the well regions 30 with the first separation region 21 therebetween. A source region 40, which is made of n-type silicon carbide, is formed at the location a certain distance inwardly away from the side of the second separation region 22 toward the first separation region 21, the certain distance being a distance from the edge of the well region 30 on the side of the second separation region 22. A contact region 35, which is made of p-type low-resistance silicon carbide, is formed near the surface of the well region 30 at the location further inside the source region 40. Here, the region that is made of silicon carbide (the region formed as the drift layer 20) is called a silicon carbide layer, regardless of whether ions are implanted thereinto or not.

An ohmic electrode 70 is formed on the surface of the source region 40 and on the surface of the contact region 35. A gate dielectric film 50 is formed on the surface of the source region 40 in the well region 30, on the surface of the second separation region 22, and on the surface of the well region 30 between the source region 40 and the second separation region 22. A gate electrode 60 is formed on the gate dielectric film 50 covering from the source region 40 to the second separation region 22. The part of the well region 30 near its own surface under the gate electrode 60 which faces the gate electrode 60 via the gate dielectric film 50 is a channel region.

An intermetal dielectric film 55 is formed on the gate electrode 60 and on the gate dielectric film 50. A source electrode 80 is formed on the first separation region 21, on the contact region 35, and on the ohmic electrode 70, on which the intermetal dielectric film 55 and the gate dielectric film 50 are not formed. The source electrode 80 and the first separation region 21 make a Schottky junction therebetween, which means, in a way, the source electrode 80 is also a Schottky electrode. The interface between the source electrode 80 and the first separation region 21 is a Schottky interface.

A backside ohmic electrode 71 is formed on the surface of the semiconductor substrate 10 on the opposite side of the drift layer 20. A drain electrode 85 is formed on the outer side of the backside ohmic electrode 71.

Figure 2:
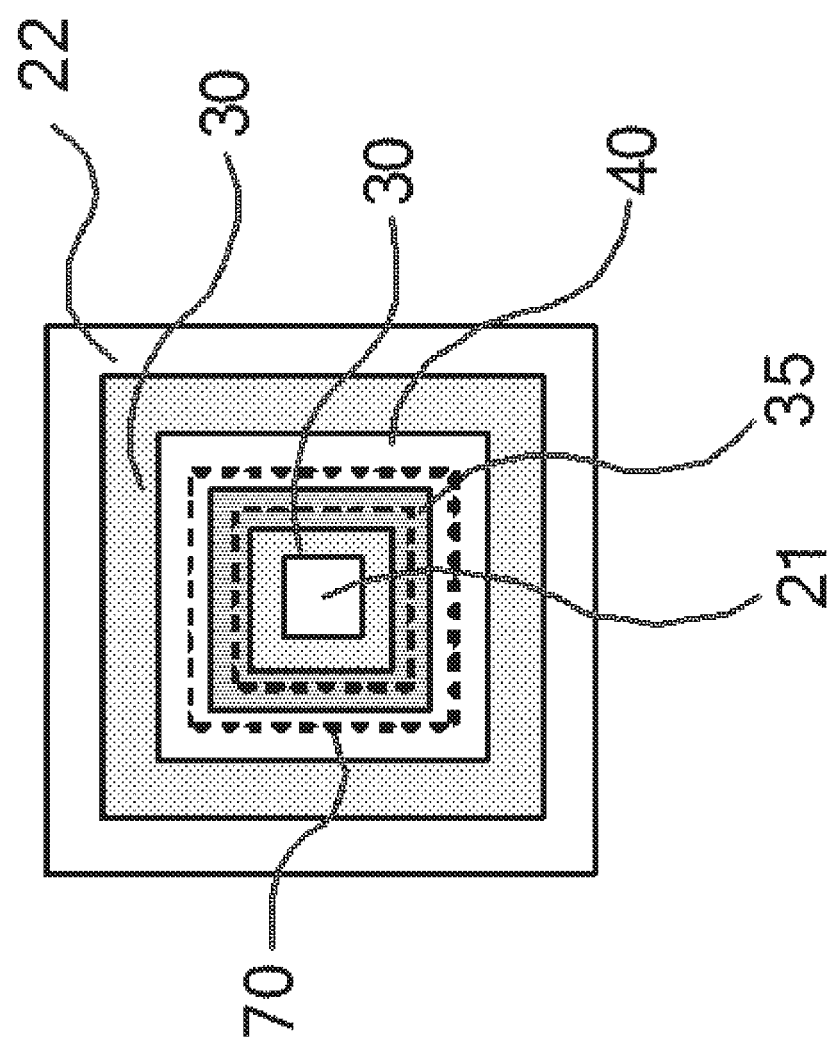
FIG. 2 is a plan diagram of the silicon carbide semiconductor device fabricated by the fabrication method for the silicon carbide semiconductor device according to Embodiment 1.
Figure 3:
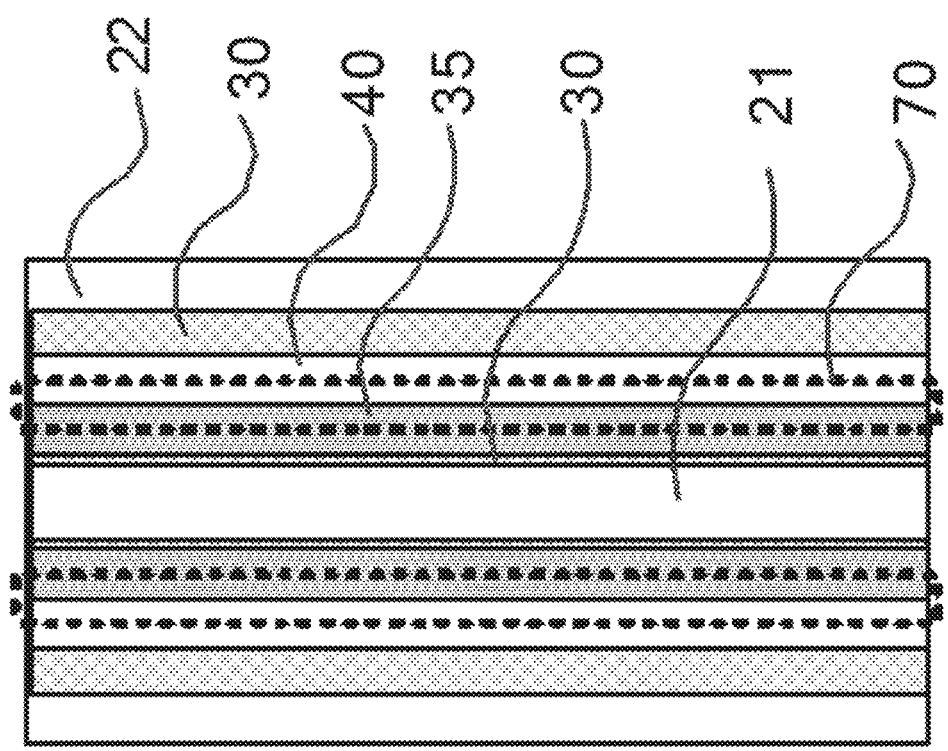
FIG. 3 is a plan diagram of another form of the silicon carbide semiconductor device fabricated by the fabrication method for the silicon carbide semiconductor device according to Embodiment 1.

FIG. 2 is a plan diagram of the unit cell of the active region of the SiC-MOSFET with a built-in SBD fabricated by the fabrication method according to Embodiment 1 of this disclosure. FIG. 2 shows the arrangement of the regions on the surface of the silicon carbide layer in the unit cell. The dashed lines show the region where the ohmic electrode 70 is formed. In FIG. 2, the well region 30, the contact region 35, the source region 40, the well region 30, and the second separation region 22 are formed in this order from inside to outside around the first separation region 21. The gate electrode 60 is not shown but is formed outside the ohmic electrode 70. The unit cell of the active region of the SiC-MOSFET with a built-in SBD fabricated by the fabrication method according to Embodiment 1 of this disclosure may be a striped unit cell, whose plan diagram is shown in FIG. 3.

As shown in FIG. 1 and FIG. 2, the ohmic electrode 70 and the source electrode 80 (Schottky electrode) are formed in one contact hole that is provided through the gate dielectric film 50 and the intermetal dielectric film 55.

As understood from FIG. 2, the well region 30 and some other portions, which appear to be more than one in FIG. 1, may be continuous behind the page of the cross-section drawing. Also, the structures of the unit cell shown in FIG. 1 through FIG. 3 are arranged repeatedly to be the active region.

Hereinafter, the fabrication method for the SiC-MOSFET with a built-in SBD, which is a silicon carbide semiconductor device, according to Embodiment 1 of this disclosure will be described using the schematic cross-sectional diagrams shown in FIG. 4 to FIG. 9.

Figure 4:
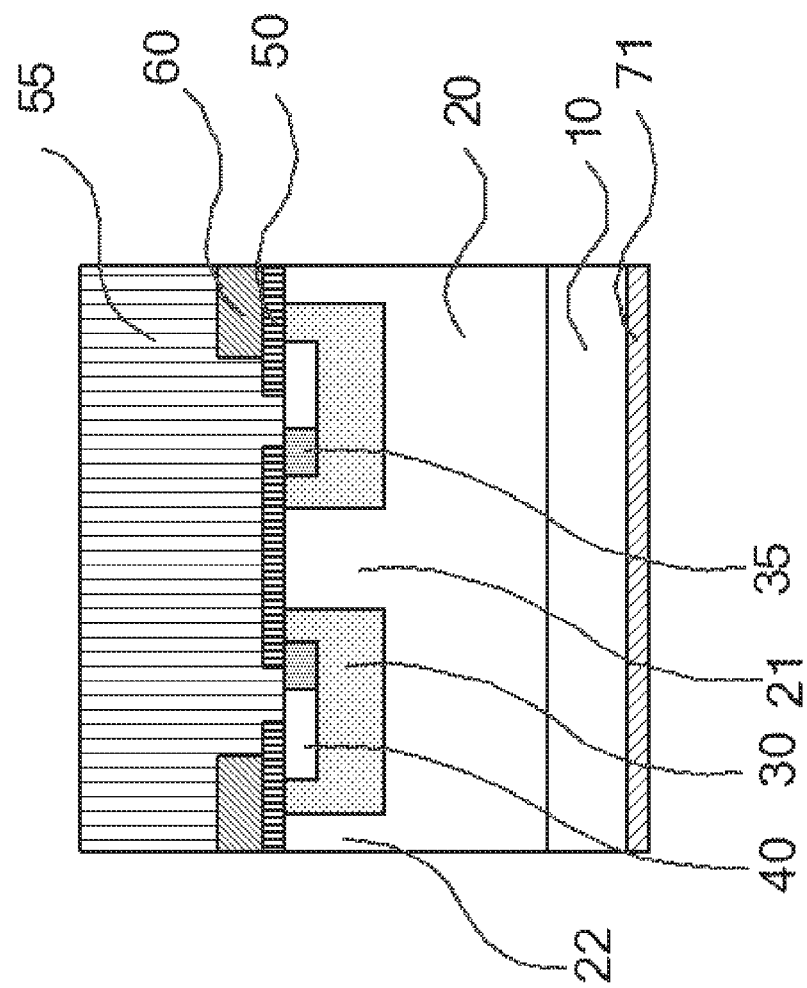
FIG. 4 is a cross-sectional diagram illustrating the fabrication method for the silicon carbide semiconductor device according to Embodiment 1.

FIG. 4 is a schematic cross-sectional diagram showing a structure in the middle stage of the fabrication process of the SiC-MOSFET with a built-in SBD according to Embodiment 1 of this disclosure shown in FIG. 1 to FIG. 3. The followings are descriptions of the process up to this stage.

Firstly, the drift layer 20 made of n-type silicon carbide with a thickness of 5 to 80 μm is epitaxially grown on the semiconductor substrate 10 which is an n-type low-resistance 4H-polytype silicon carbide substrate and whose first main plane orientation is (0001) plane with an off angle, by using a chemical vapor deposition (CVD) method at an impurity concentration of $1\times10^{15}$ to $1\times10^{17}$ $cm^{-3}$. The thickness of the drift layer 20 may be more than 80 μm depending on the withstand voltage of the silicon carbide semiconductor device.

Next, at given regions of the surface of the drift layer 20, the implantation mask is formed with photoresist or the like, and aluminum (Al) ions, which are p-type impurities, are implanted thereinto. The depth of ion implantation of Al ions should be about 0.5 to 3 μm, not exceeding the thickness of the drift layer 20. The impurity concentration of the Al ions by the ion implantation is in the range of $1\times10^{17}$ to $1\times10^{19}$ $cm^{-3}$, which is higher than the impurity concentration of the drift layer 20. Then, the implantation mask is removed. The region where the Al ions are implanted in this process become the well region 30.

Next, an implantation mask is formed by photoresist or the like such that a given area over the surface of the well region 30 in the drift layer 20 is opened, the opening area being smaller than the area of the well region 30, and nitrogen (N) ions, which are n-type impurities, are implanted thereinto. The depth of ion implantation of N ions should be shallower than the thickness of the well region 30. Also, the impurity concentration of the ion-implanted N should be within the range of $1\times10^{18}$ to $1\times10^{21}$ $cm^{-3}$ to be higher than the p-type impurity concentration of the well region 30. The region of n-type among the regions where the N ions are implanted in this process become the source region 40. Then, the implantation mask is removed.

Also, by the same method, the contact region 35 is formed by implanting Al ions into a given region inside the well region 30 at an impurity concentration higher than that of the well region 30.

Next, by thermal processing equipment, annealing is performed in an inert gas atmosphere, such as argon (Ar) gas, at a temperature of 1300 to 1900 degrees C. for 30 seconds to one hour. This annealing processing electrically activates the implanted N ions and Al ions.

Next, the silicon carbide surfaces of the drift layer 20, the well region 30, the source region 40, and the contact region 35 are thermally oxidized to form a silicon oxide layer of a required thickness, which is the gate dielectric film 50. Then, an electrically conductive polycrystalline silicon film is formed on top of the gate dielectric film 50 by the Low-Pressure CVD, and the gate electrode 60 is obtained by patterning the polysilicon film. Next, the intermetal dielectric film 55 made of silicon oxide is formed by the Low-Pressure CVD.

Then, the backside ohmic electrode 71 is formed on the surface of the semiconductor substrate 10 where the drift layer 20 is not formed. Thus the structure, whose cross-section is shown in FIG. 4, is obtained.

Next, the contact hole, which penetrates the intermetal dielectric film 55 and the gate dielectric film 50 to reach the contact region 35 and the source region 40 in the active region, is formed by a dry etching method. The dry etching method allows formation of the contact hole whose inner side is perpendicular to the surface of the silicon carbide layer, which leads to a reduction in the repetition distance (cell pitch) of the unit cells and an increase in the on-current density per unit area.

Then, a metal film, whose main component is nickel (Ni), is formed by sputtering or another method. The following thermal processing at a temperature between 600 and 1100 degrees C. causes the metal film with its main component Ni and the silicon carbide layer in the contact hole to react with each other to form silicide between the silicon carbide layer and the metal film. The metal film with Ni component makes the silicide be nickel silicide. Next, the residual metal film other than the silicide formed as a result of the reaction is removed by wet etching. The silicide thus formed is the ohmic electrode 70. Here, an oxidized layer 75 is unexpectedly formed on the surface of the ohmic electrode 70.

Figure 5:
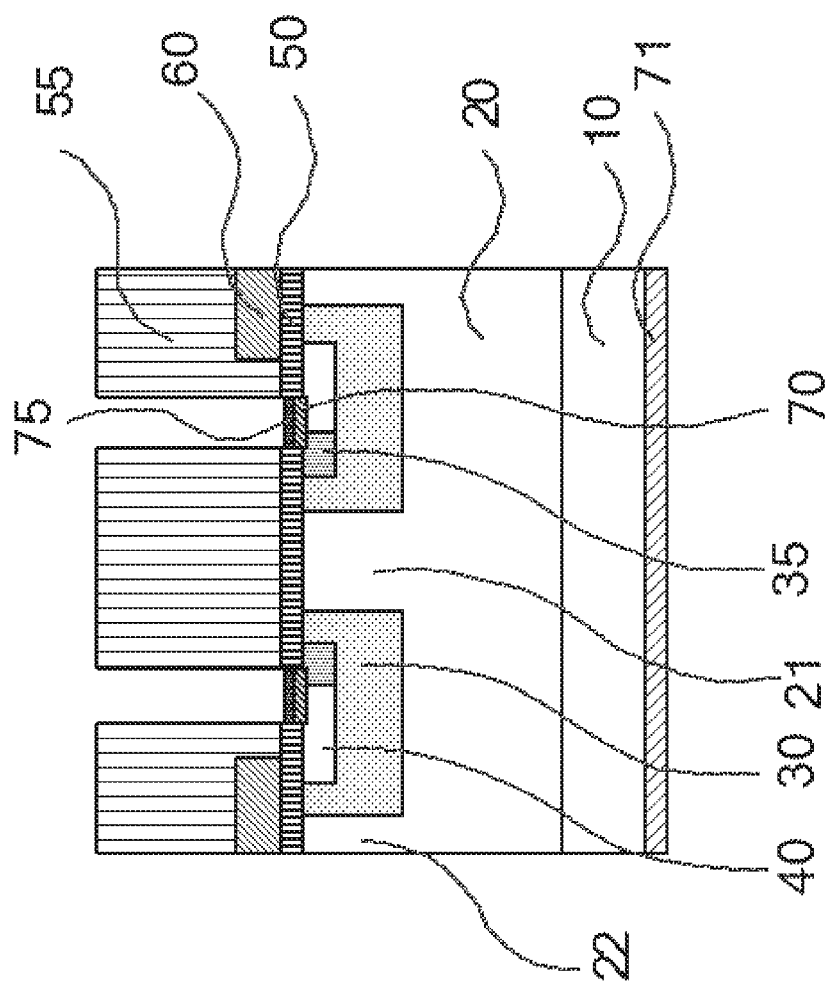
FIG. 5 is a cross-sectional diagram illustrating the fabrication method for the silicon carbide semiconductor device according to Embodiment 1.

FIG. 5 illustrates the cross-section of the product in process at the stage where the ohmic electrode 70 is formed in the contact hole. Here, the ohmic electrode 70 adjoins the gate dielectric film 50 or both of the gate dielectric film 50 and the intermetal dielectric film 55.

Figure 6:
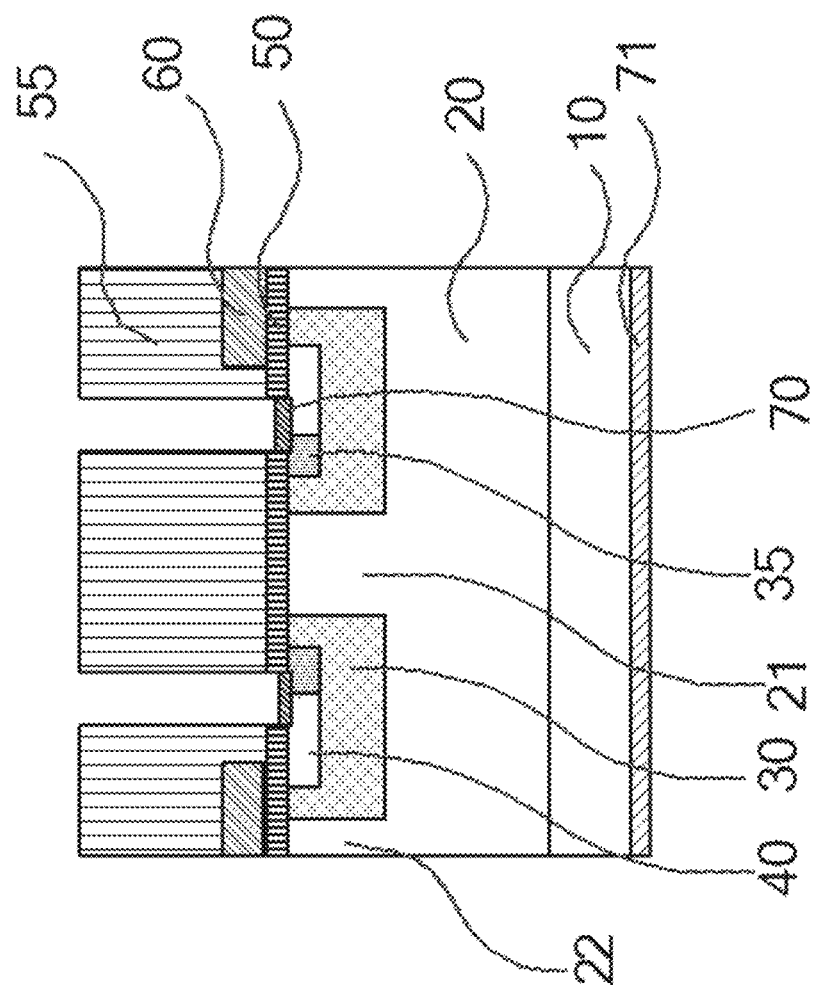
FIG. 6 is a cross-sectional diagram illustrating the fabrication method for the silicon carbide semiconductor device according to Embodiment 1.

Next, as shown in the cross-sectional diagram of FIG. 6, the oxidized layer 75 on the surface of the ohmic electrode 70 is removed by light etching with the hydrofluoric acid. The etching amount during the light etching is controlled by the processing time or the hydrofluoric acid concentration so as for the exposed intermetal dielectric film 55 not to disappear. Light plasma etching may be used for the removal of the oxidized layer 75. Here, the term "removal" does not only mean to eliminate the oxidized layer completely but also means a case in which some part of the oxidized layer remains after the removal.

Figure 7:
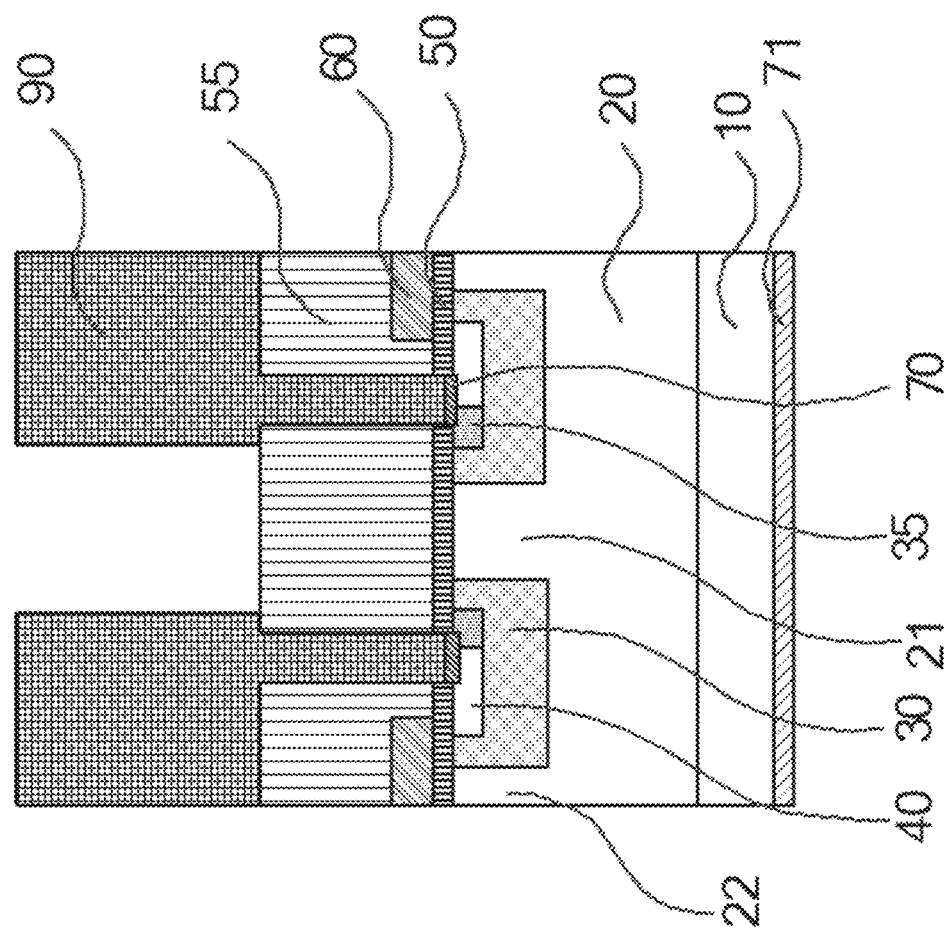
FIG. 7 is a cross-sectional diagram illustrating the fabrication method for the silicon carbide semiconductor device according to Embodiment 1.

Next, as shown in the cross-sectional diagram of FIG. 7, in order to etch a portion of the gate dielectric film 50 and a portion of the intermetal dielectric film 55 over the region including the surface of the first separation region 21, a mask, such as a resist mask 90, is formed on the surface of the ohmic electrode 70 having the oxidized layer 75 removed and on the intermetal dielectric film 55 by a photolithography method, the mask having an opening on the side opposite to the side adjoining the gate dielectric film 50 (or adjoining both the gate dielectric film 50 and the intermetal dielectric film 55) of the side at which the gate electrode 60 is formed.

Figure 8:
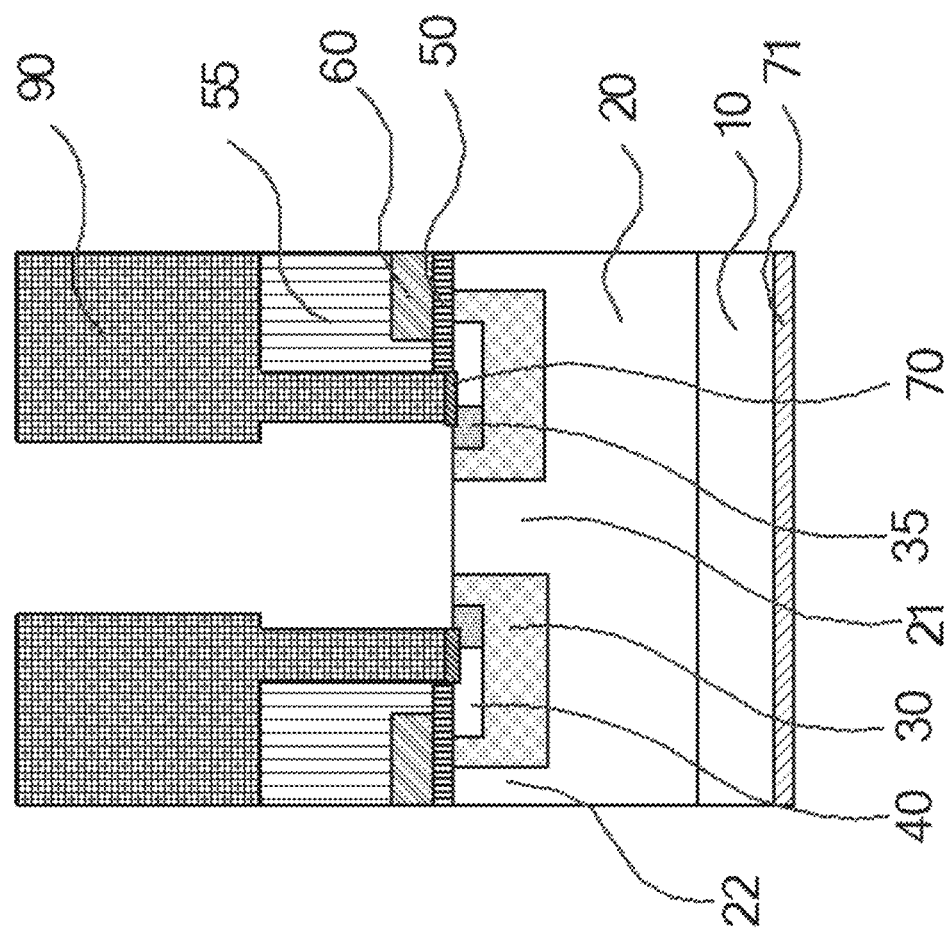
FIG. 8 is a cross-sectional diagram illustrating the fabrication method for the silicon carbide semiconductor device according to Embodiment 1.

Next, as shown in FIG. 8, with the resist mask 90 formed, the gate dielectric film 50 and the intermetal dielectric film 55 over the region including the surface of the first separation region 21 are wet etched using an etching solution containing the hydrofluoric acid. In this case, the gate dielectric film 50 and the intermetal dielectric film 55 over the region including the surface of the first separation region 21 are the films to be etched. The regions to be wet etched are regions including the surfaces of the first separation region 21, the well region 30 adjoining the first separation region 21, and the contact region 35. The concentration of the hydrofluoric acid in the etching solution used for the wet etching of the gate dielectric film 50 and the intermetal dielectric film 55 should preferably be higher than the concentration of the hydrofluoric acid in the solution used for the light etching of the oxidized layer 75 on the surface of the ohmic electrode 70.

Figure 9:
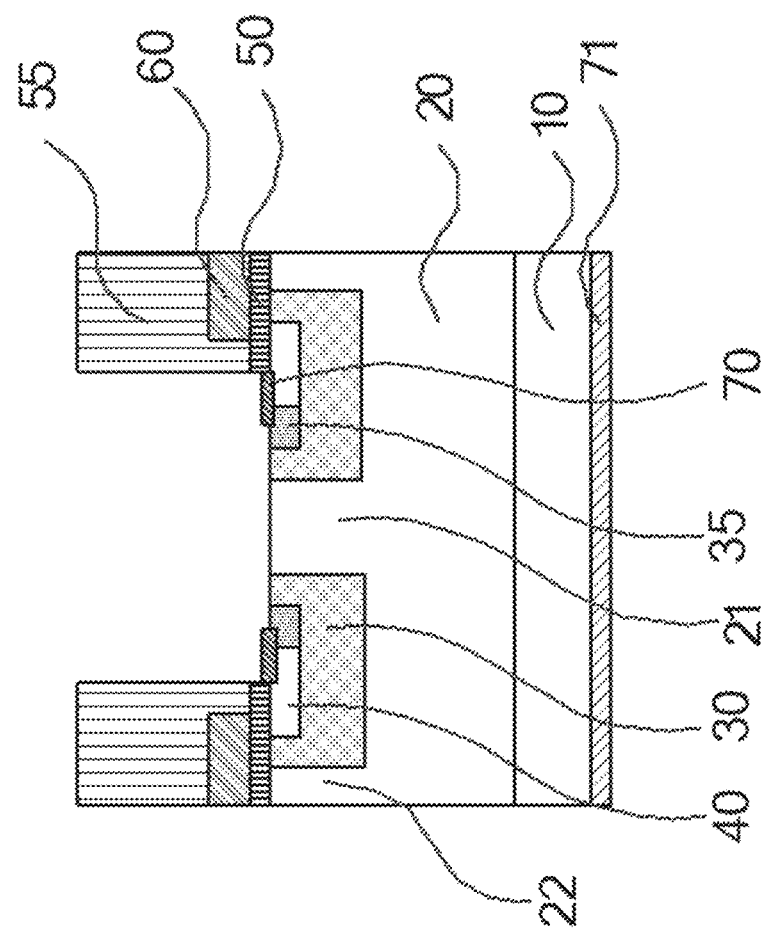
FIG. 9 is a cross-sectional diagram illustrating the fabrication method for the silicon carbide semiconductor device according to Embodiment 1.
Figure 10:
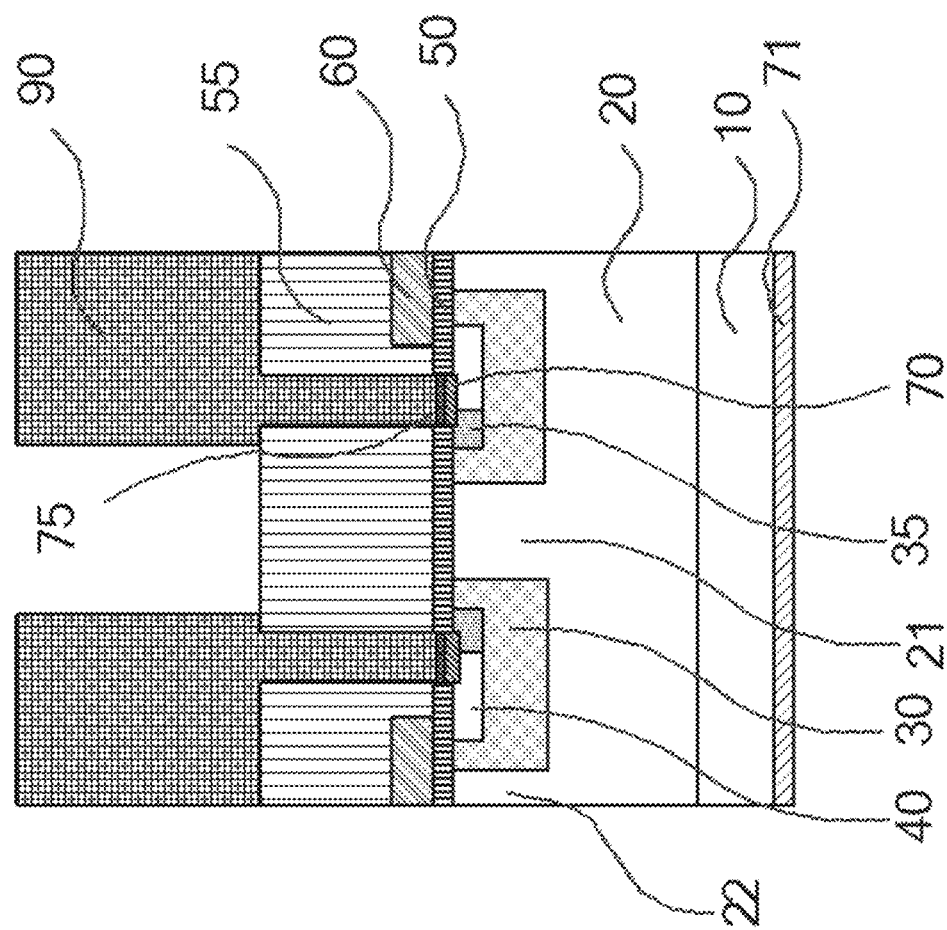
FIG. 10 is a cross-sectional diagram illustrating a fabrication method in a case where the fabrication method for the silicon carbide semiconductor device according to Embodiment 1 is not adopted.
Figure 11:
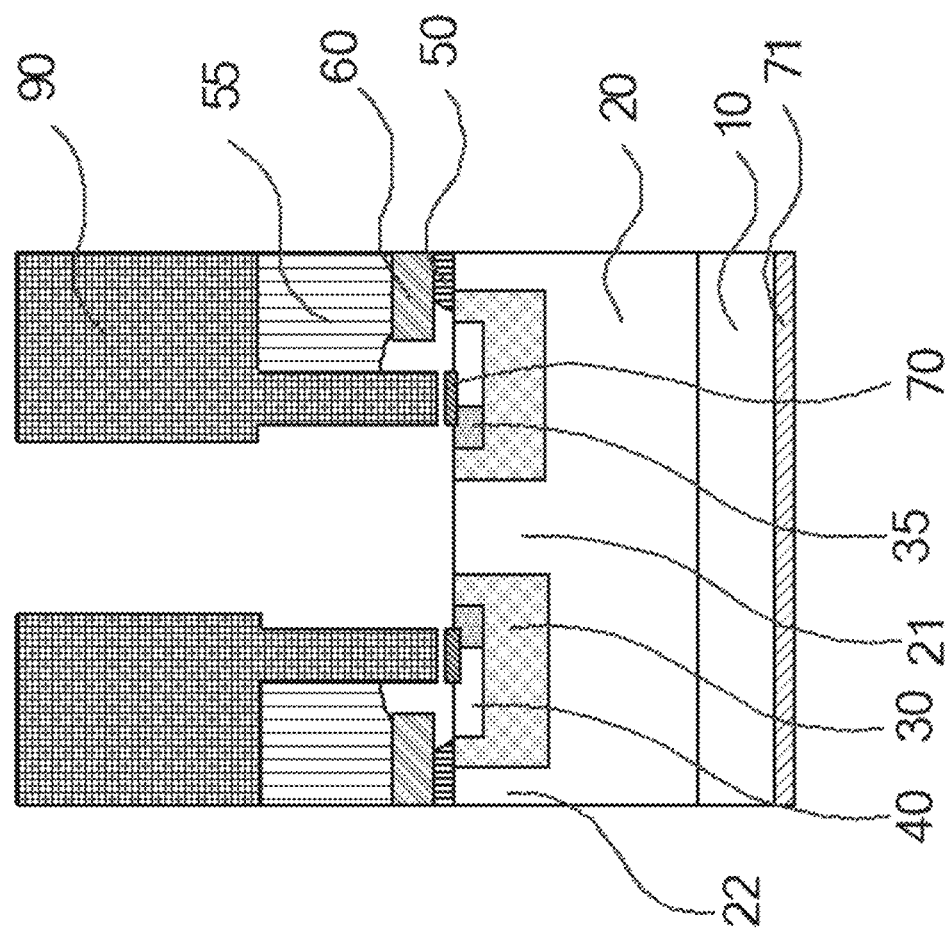
FIG. 11 is a cross-sectional diagram illustrating the fabrication method in the case where the fabrication method for the silicon carbide semiconductor device according to Embodiment 1 is not adopted.

Next, the resist mask 90 is removed as shown in the cross-sectional diagram of FIG. 9. Then, the source electrode 80, which is to make a Schottky junction with the first separation region 21, is formed on the first separation region 21 and its surrounding region, and the drain electrode 85, which is to be in contact with the backside ohmic electrode existing on the back side, is formed. Thus, the SiC-MOSFET with a built-in SBD, shown in the cross-sectional diagram of FIG. 1, is fabricated.

The source electrode 80 can be made of a single material. However, as far as it makes a Schottky junction with the first separation region 21, the source electrode 80 can be made of a plurality of materials. For example, it may have a two-layer structure with Ti at its bottom and Al on its top.

Also, the silicide is not limited to nickel silicide, but may be titanium silicide, aluminum silicide, or the like.

Although the dielectric film to be etched in the above descriptions is the silicon oxidized film, the film to be etched may be a silicon oxidized film containing nitrogen, phosphorus, or boron.

Here, as a counter reference, the case in which the fabrication process is performed without removing the oxidized layer 75 formed on the ohmic electrode 70 will be described using the schematic cross-sectional diagrams of FIG. 10 to FIG. 13. As shown in the cross-sectional diagram of FIG. 10, the resist mask 90 is formed on the product in process with which the processing steps up to the step shown in the cross-sectional diagram of FIG. 5 are completed. Then, the gate dielectric film 50 and the intermetal dielectric film 55 are wet etched using the etching solution containing the hydrofluoric acid. In this case, as shown in the cross-sectional diagram of FIG. 11, the etching with acid containing the hydrofluoric acid is likely to etch the oxidized layer 75 on the ohmic electrode 70, so that the gate dielectric film 50 and the intermetal dielectric film 55 existing near the gate electrode 60 on the other side of the resist mask 90 are also etched.

Figure 12:
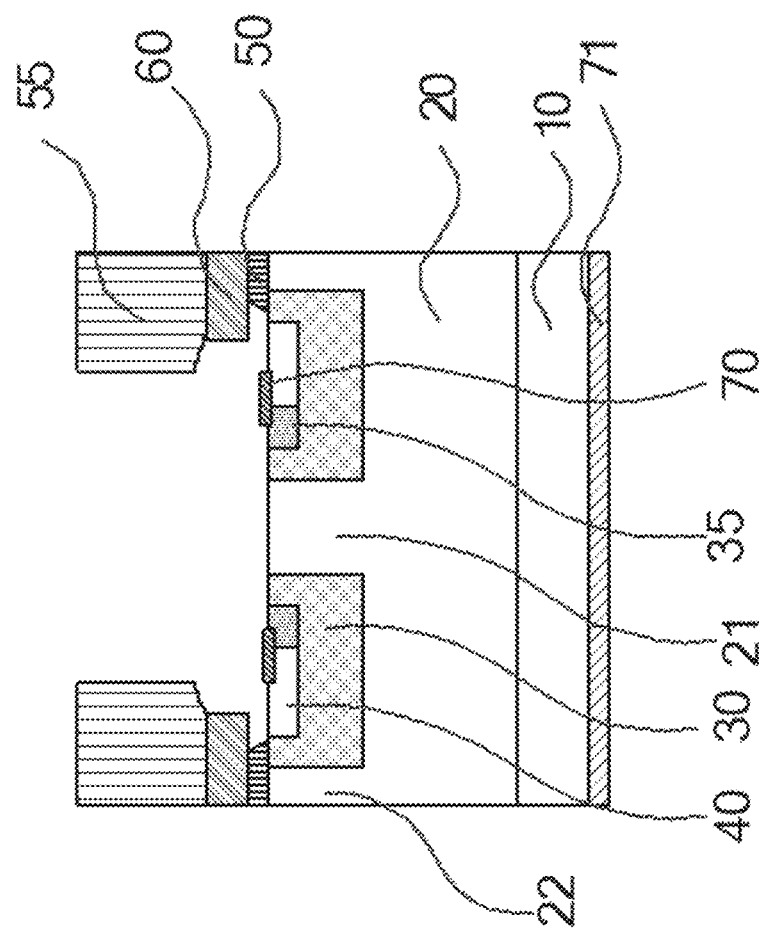
FIG. 12 is a cross-sectional diagram illustrating the fabrication method in the case where the fabrication method for the silicon carbide semiconductor device according to Embodiment 1 is not adopted.
Figure 13:
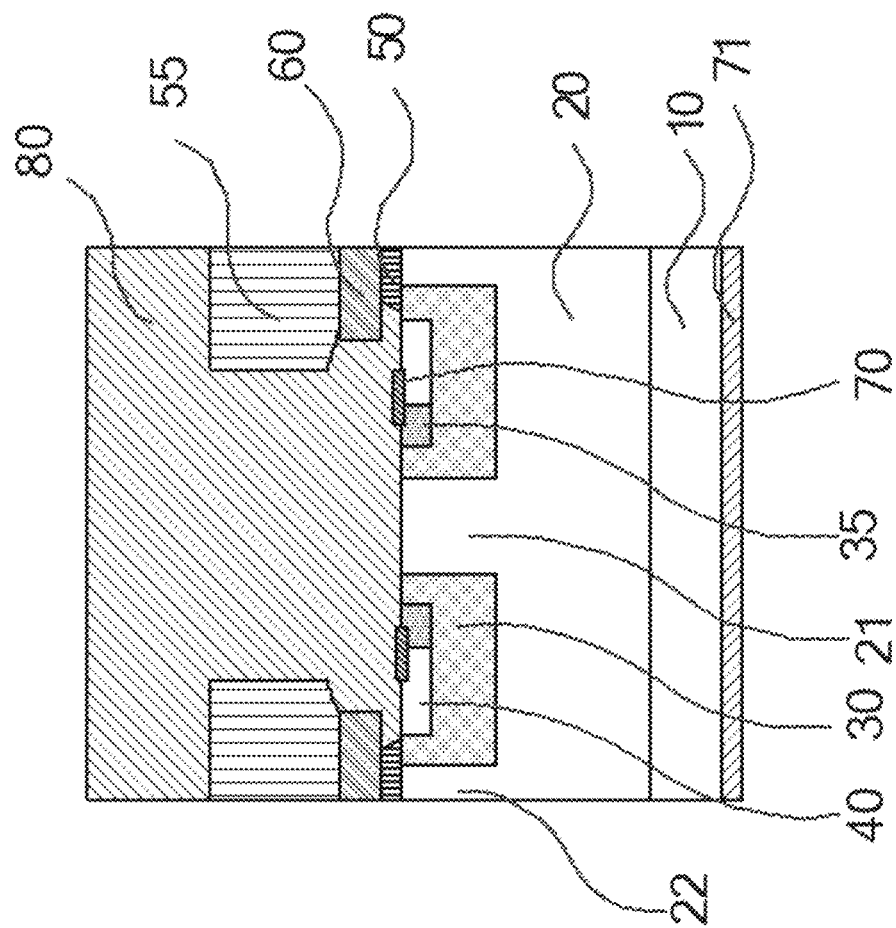
FIG. 13 is a cross-sectional diagram illustrating the fabrication method in the case where the fabrication method for the silicon carbide semiconductor device according to Embodiment 1 is not adopted.

Next, the resist mask 90 is removed as shown in the cross-sectional diagram of FIG. 12 and the source electrode 80 is formed. As a result, as shown in the cross-sectional diagram of FIG. 13, a product with fabrication failure, in which the source electrode 80 and the gate electrode 60 are short-circuited, is obtained.

According to the fabrication method for the SiC-MOSFET with a built-in SBD, which is a silicon carbide semiconductor device, of the present embodiment, the resist mask 90 is formed on the ohmic electrode 70 after the oxidized layer 75 having formed on the surface of the ohmic electrode 70 is removed. Therefore, during the subsequent wet etching by the etching solution containing the hydrofluoric acid, the etching solution does not reach the vicinity of the gate electrode 60. This prevents fabrication of a product with failure.

Embodiment 2

First, the configuration of a silicon carbide semiconductor device fabricated by the fabrication method according to Embodiment 2 of this disclosure will be described.

Figure 14:
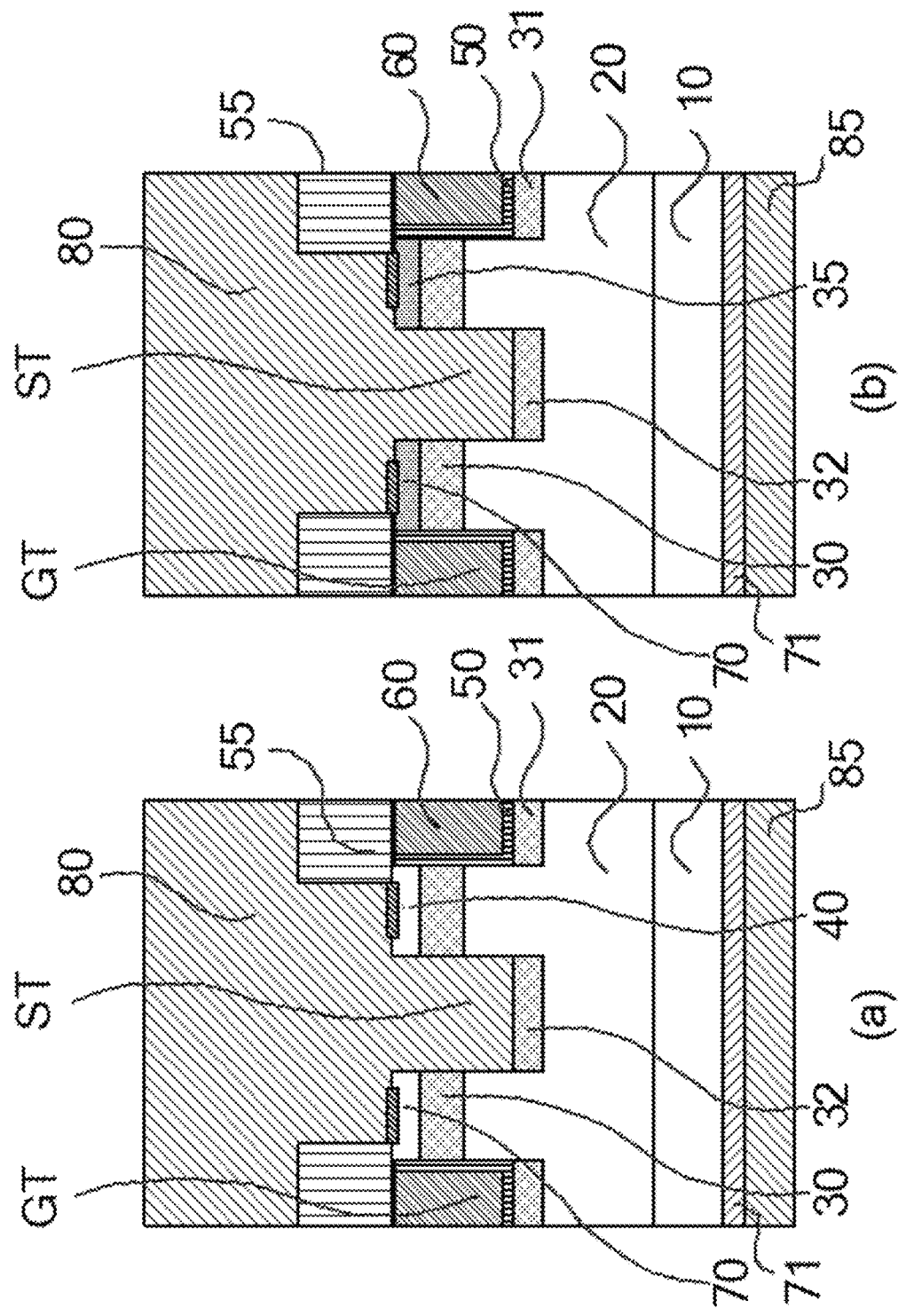
FIG. 14 is cross-sectional diagrams of a silicon carbide semiconductor device fabricated by a fabrication method for a silicon carbide semiconductor device according to Embodiment 2.
Figure 15:
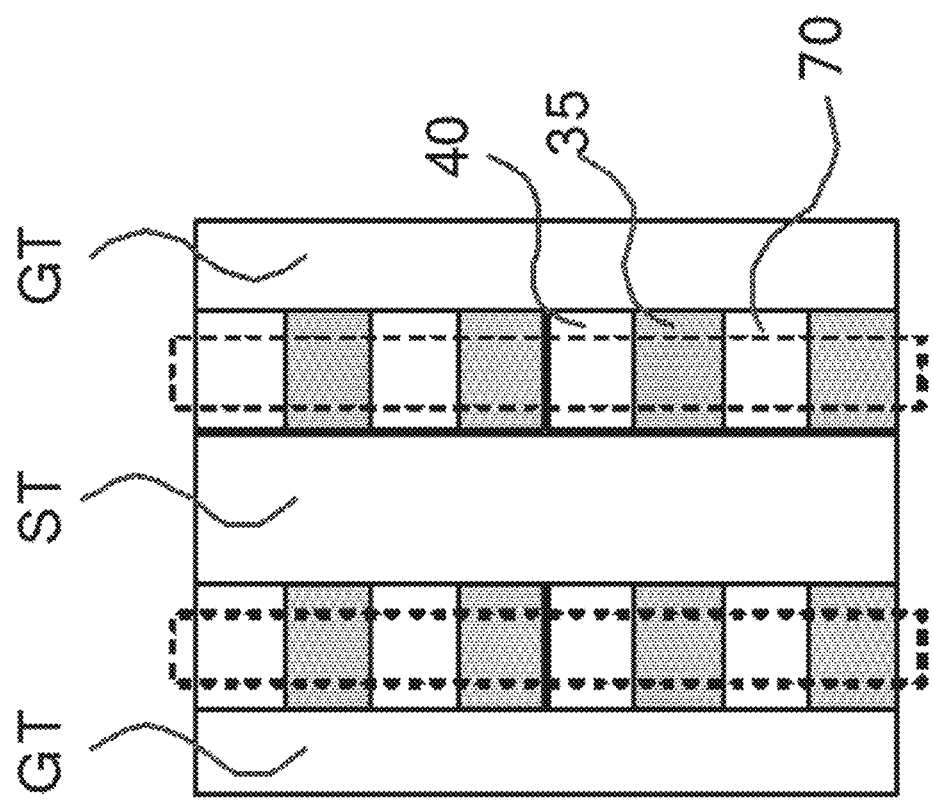
FIG. 15 is a plan diagram of the silicon carbide semiconductor device fabricated by the fabrication method for the silicon carbide semiconductor device according to Embodiment 2.

FIG. 14 is schematic cross-sectional diagrams of a unit cell of an active region of a silicon carbide MOSFET with a built-in Schottky barrier diode (SiC-MOSFET with a built-in SBD), which is the silicon carbide semiconductor device fabricated by the fabrication method according to Embodiment 2. FIG. 15 is a schematic plan diagram of the unit cell of the active region of the SiC-MOSFET with a built-in SBD, in which the regions of the ohmic electrodes 70 formed are shown by the broken lines. FIG. 14(a) shows a cross section where the source region 40 shown in FIG. 15 exists; FIG. 14(b) shows a cross section where the contact region 35 in FIG. 15 exists. Also in the following FIG. 16 to FIG. 23, (a) of each drawing shows the cross section where the source region 40 shown in FIG. 15 exists; (b) of each drawing shows the cross section where the contact region 35 shown in FIG. 15 exists.

In Embodiment 1, the fabrication method for the silicon carbide semiconductor device in which a planar-type MOSFET and an SBD are integrated was described. In Embodiment 2, the fabrication method for the silicon carbide semiconductor device in which a trench-type MOSFET and an SBD formed on the trench's side wall are integrated will be described. In the SiC-MOSFET with a built-in SBD according to the present embodiment, the MOSFET is formed in a gate trench GT and the SBD is formed in a Schottky trench ST. A second-conductive type first protective diffusion region 31 is formed in the drift layer 20 at the place where it touches the bottom of the gate trench GT. The second-conductive type second protective diffusion region 32 is formed in the drift layer 20 at the place where it touches the bottom of the Schottky trench ST. Also, as shown in FIG. 15, the source regions 40 and the contact regions 35 are arranged alternately at the surface sides of the well regions 30, which are the regions between the gate trenches GT and the Schottky trench ST, along the extending direction of the stripe-type trenches. The other features are the same as in Embodiment 1, so detailed descriptions are omitted.

In FIG. 14, the drift layer 20 made of n-type silicon carbide is formed on the surface of the semiconductor substrate 10 made of n-type low-resistance silicon carbide. The well region 30 is provided in the surface layer portion of the drift layer 20. The source region 40 and the contact region 35 are formed on the surface layer portion of the well region 30 as shown in FIG. 14(a) and FIG. 14(b), respectively. The two types of striped trenches, which reach the drift layer 20 penetrating the source region 40 (or the contact region 35) and the well region 30, are formed alternately in the direction orthogonal to the trenches' extending direction.

One of the two types of the trenches is the Gate trench GT. There is a gate electrode 60 formed in the gate trench GT via the gate dielectric film 50. The ohmic electrode 70 is formed on the source region 40 and on the contact region 35. The p-type first protective diffusion region 31 is formed in the drift layer 20 at the place where it touches the bottom of the gate trench GT. The intermetal dielectric film 55 is formed over the gate electrode 60.

The other of the two types of the trenches is the Schottky trench ST. The p-type second protective diffusion region 32 is formed in the drift layer 20 at the place where it touches the bottom of the Schottky trench ST. The source electrode 80 which makes a Schottky junction with the drift layer 20 is formed in the Schottky trench ST. The interface between the source electrode 80 and the drift layer 20 is a Schottky interface. The source electrode 80 also exists on the intermetal dielectric film 55 and on the ohmic electrode 70.

A backside ohmic electrode 71 is formed on the surface on the opposite side of the drift layer 20 of the semiconductor substrate 10. The drain electrode 85 is formed on the outer side of the backside ohmic electrode 71.

Hereinafter, the fabrication method for the SiC-MOSFET with a built-in SBD, which is a silicon carbide semiconductor device, according to Embodiment 2 of this disclosure will be described using the schematic cross-sectional diagrams shown in FIG. 16 to FIG. 23.

Figure 16:
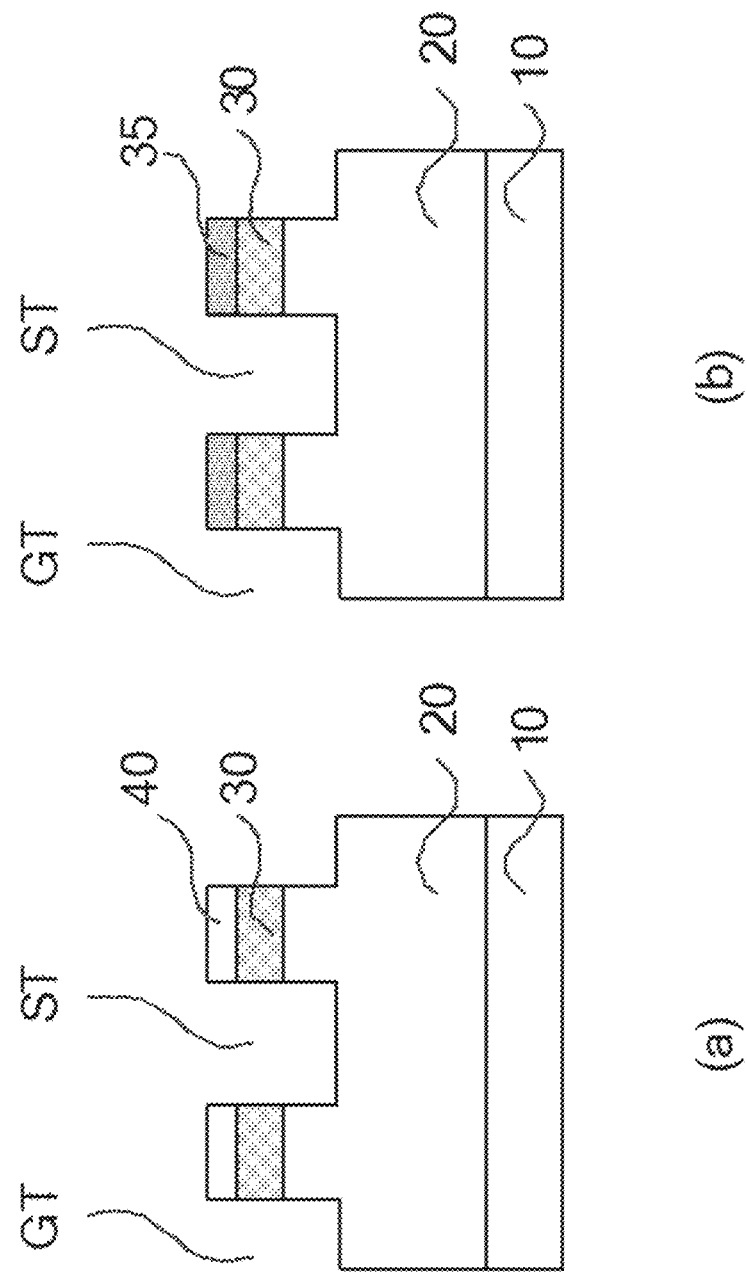
FIG. 16 is cross-sectional diagrams illustrating the fabrication method for the silicon carbide semiconductor device according to Embodiment 2.
Figure 17:
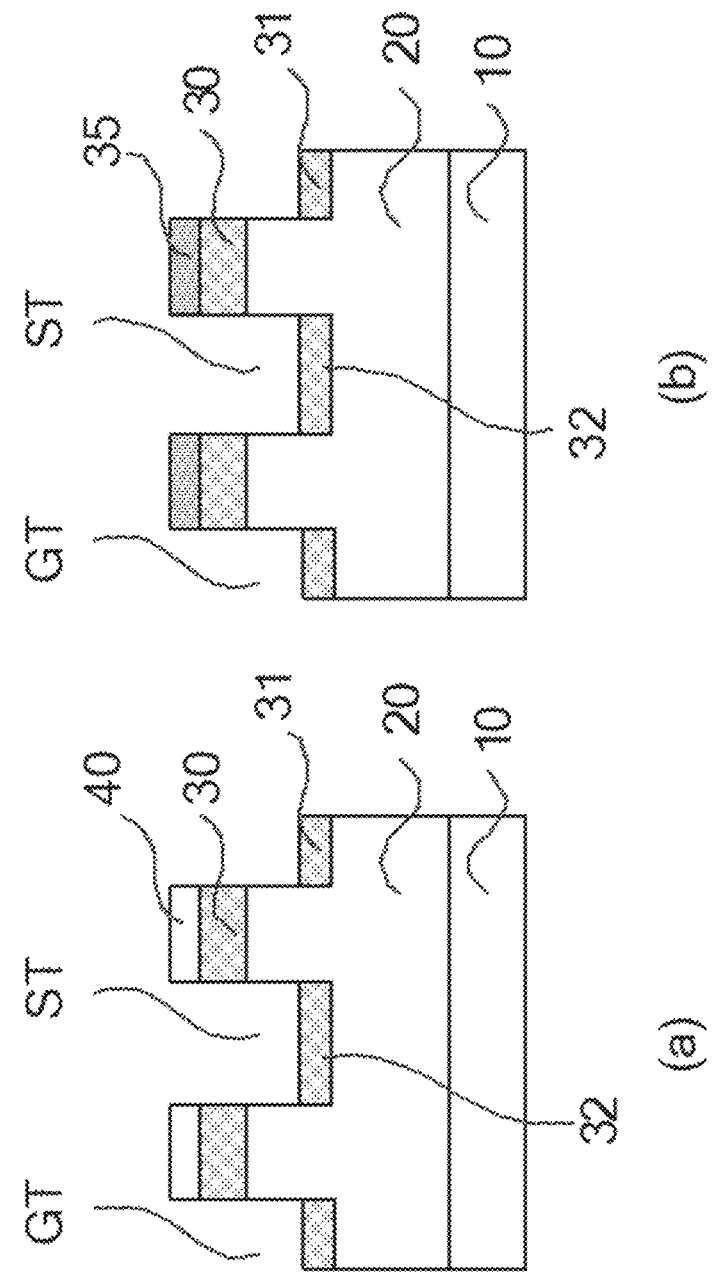
FIG. 17 is a cross-sectional diagram illustrating the fabrication method for the silicon carbide semiconductor device according to Embodiment 2.
Figure 18:
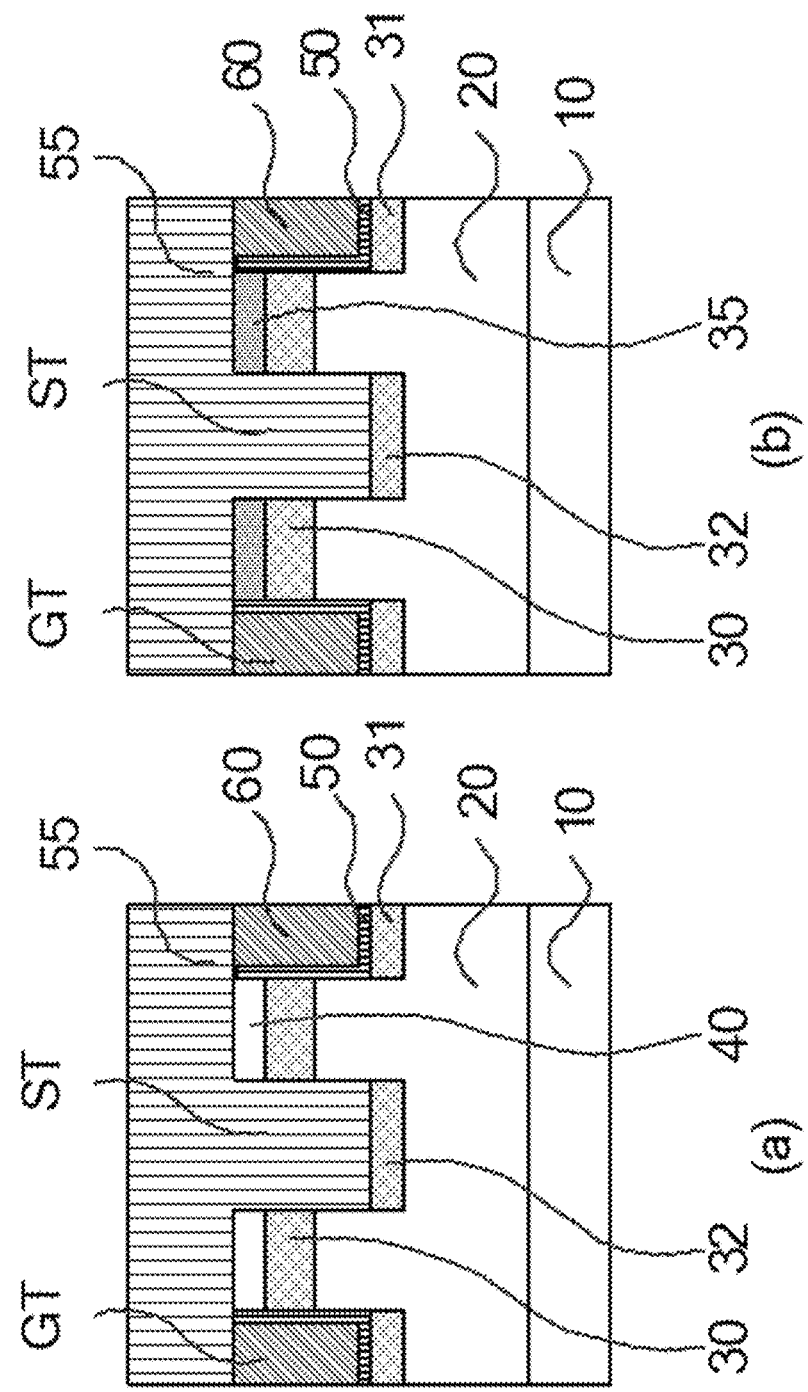
FIG. 18 is a cross-sectional diagram illustrating the fabrication method for the silicon carbide semiconductor device according to Embodiment 2.

FIG. 16 is schematic cross-sectional diagrams showing a structure in the middle stage of the fabrication process of the SiC-MOSFET with a built-in SBD according to Embodiment 2 of this disclosure shown in FIG. 14 and FIG. 15. The following is description of the process up to this stage.

Firstly, the drift layer 20 made of n-type silicon carbide with a thickness of 5 to 80 μm is epitaxially grown on the semiconductor substrate 10 which is an n-type low-resistance 4H-polytype silicon carbide substrate and whose first main plane orientation is (0001) plane with an off angle, by a CVD method at an impurity concentration of $1 \times 10^{15}$ to $1 \times 10^{17}$ cm$^{-3}$.

Next, Al ions, which are p-type impurities, are implanted from the surface of the drift layer 20. The depth of ion implantation of Al ions should be about 0.5 to 3 μm, not exceeding the thickness of the drift layer 20. Also, the impurity concentration of the ion-implanted Al should be within the range of $1 \times 10^{17}$ to $1 \times 10^{19}$ cm$^{-3}$ to be higher than the impurity concentration of the drift layer 20. The region having Al ions implanted in this process become the well region 30.

Next, an implantation mask is formed by photoresist or the like such that a given area over the surface of a well region 30 is opened, and N ions, which are n-type impurities, are implanted thereinto. The depth of ion implantation of N should be shallower than the thickness of the well region 30. Also, the impurity concentration of the ion-implanted N should be within the range of $1 \times 10^{18}$ to $1 \times 10^{21}$ cm$^{-3}$ to be higher than the p-type impurity concentration of the well region 30. The region of n-type in the regions having N ions implanted in this process becomes the source region 40. Then, the implantation mask is removed.

Also, by the same method, the contact region 35 is formed by implanting Al ions into a given region inside the well region 30 at an impurity concentration higher than that of the well region 30.

Next, a resist mask that has an opening over the area where the source region 40 is formed and over the area where contact region 35 is formed is formed. Then the gate trench GT and the Schottky trench ST, which reach the drift layer 20 penetrating the source region 40 (or the contact region 35) and the well region 30, are formed by the dry etching method. Next, as shown in the schematic cross-sectional diagrams of FIG. 17, p-type impurity ions are implanted into the bottom of the gate trench GT and into the bottom of the Schottky trench ST, which both belong to the drift layer 20, to form the first protective diffusion region 31 and the second protective diffusion region 32, respectively.

The following thermal processing electrically activates the ion-implanted N and Al.

Next, the surface of the silicon carbide including the inner surfaces of the gate trench GT and the Schottky trench ST is thermally oxidized to form the silicon oxidized film, which is the gate dielectric film 50 of a required thickness. Next, on the gate dielectric film 50, conductive polycrystalline silicon film is formed by the Low-Pressure CVD. By performing patterning and etching back of this polysilicon film, the gate electrode 60 is formed only on the side of the gate trench GT. Next, as shown in the schematic cross-sectional diagrams of FIG. 18, the intermetal dielectric film 55 made of silicon oxide is formed by the Low-Pressure CVD.

Figure 19:
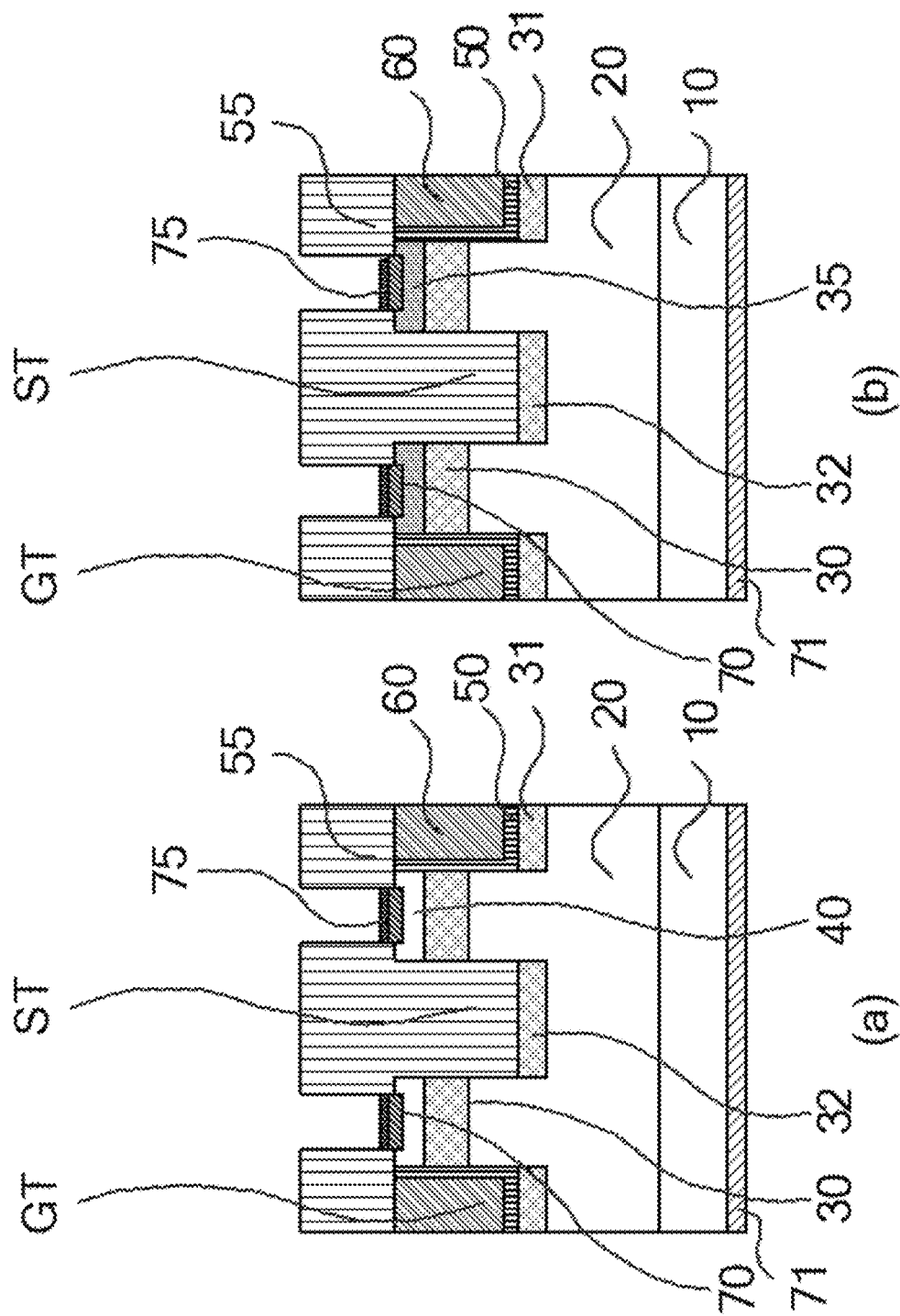
FIG. 19 is cross-sectional diagrams illustrating the fabrication method for the silicon carbide semiconductor device according to Embodiment 2.

Then, as shown in the cross-sectional diagrams of FIG. 19, the backside ohmic electrode 71 is formed on the surface of the semiconductor substrate 10 where the drift layer 20 is not formed. Also, the contact hole, which penetrates the intermetal dielectric film 55 and the gate dielectric film 50 to reach the contact region 35 and the source region 40 in the active region, is formed by a dry etching method. Within the contact hole, the silicide serving as the ohmic electrode 70 is formed. The oxidized layer 75 is unexpectedly formed on the surface of the ohmic electrode 70.

Figure 20:
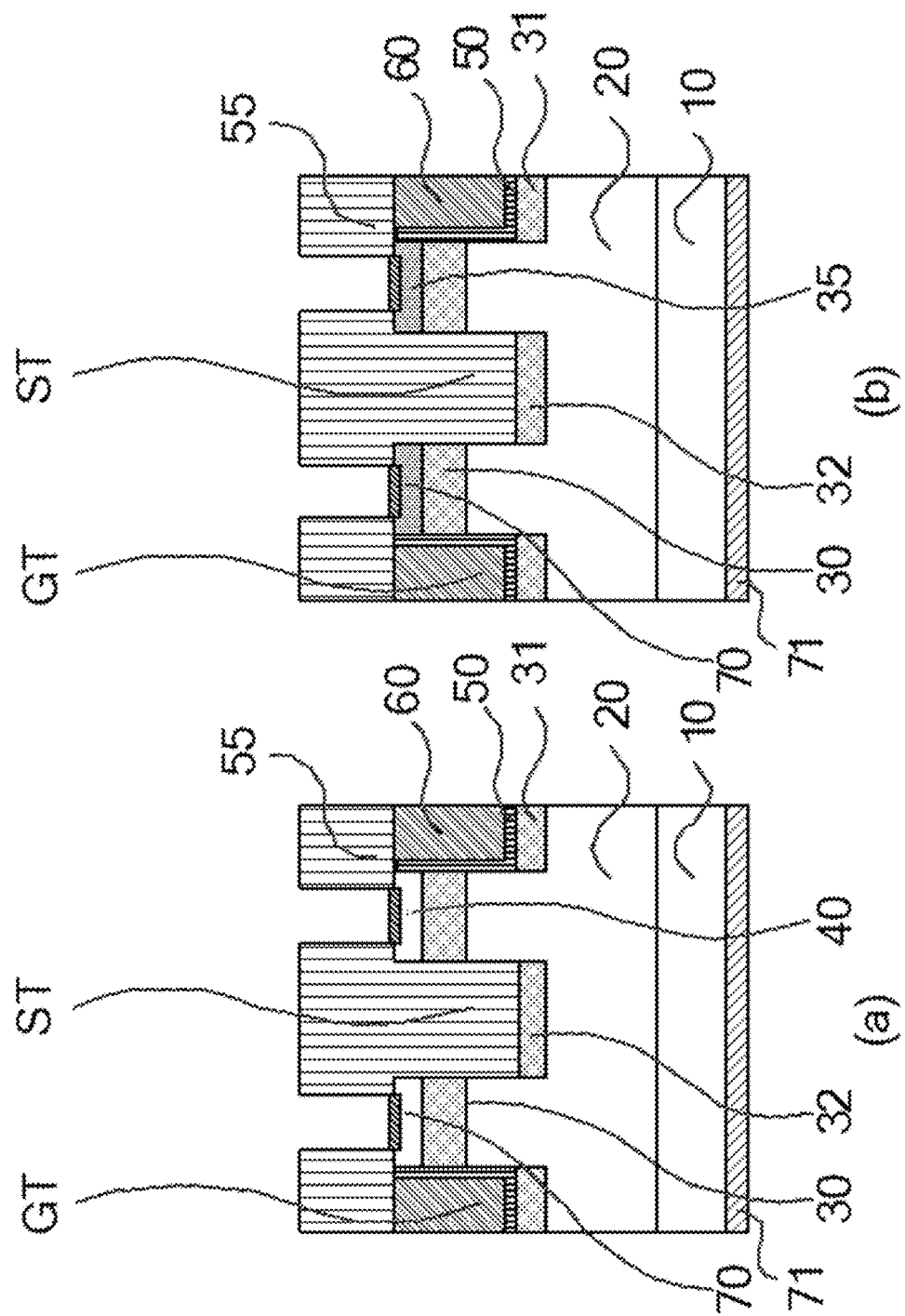
FIG. 20 is cross-sectional diagrams illustrating the fabrication method for the silicon carbide semiconductor device according to Embodiment 2.

Next, as shown in the cross-sectional diagrams of FIG. 20, the oxidized layer 75 on the surface of the ohmic electrode 70 is removed by light etching with the hydrofluoric acid.

Figure 21:
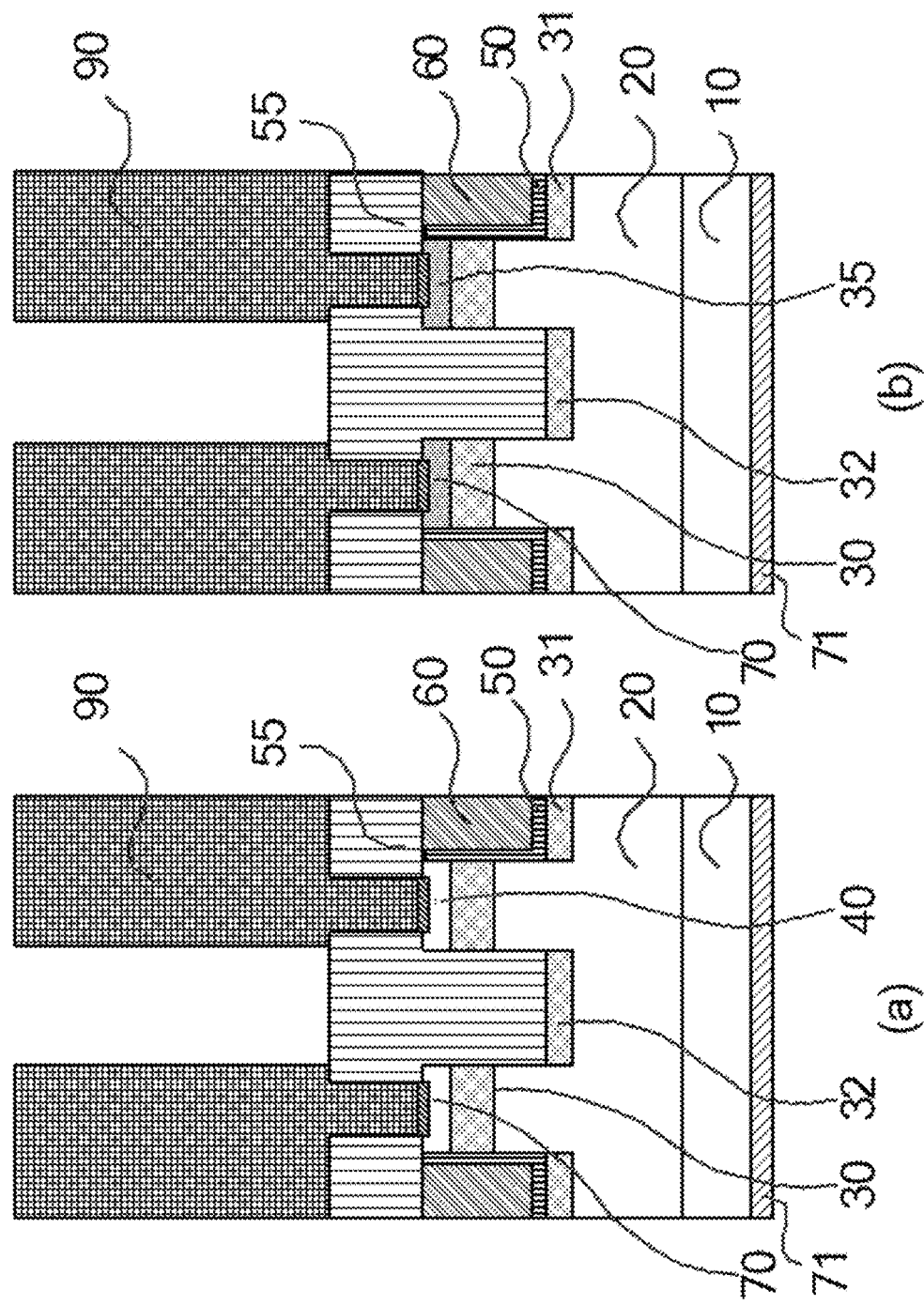
FIG. 21 is cross-sectional diagrams illustrating the fabrication method for the silicon carbide semiconductor device according to Embodiment 2.

Next, as shown in the cross-sectional diagrams of FIG. 21, in order to etch the intermetal dielectric film 55 over the Schottky trench ST, the resist mask 90 is formed on the surface of the ohmic electrode 70 having the oxidized layer 75 removed and on the intermetal dielectric film 55 by a photolithography method, the mask having an opening on the side opposite to the sides adjoining the dielectric film existing on the side in which the gate electrode 60 is formed.

Figure 22:
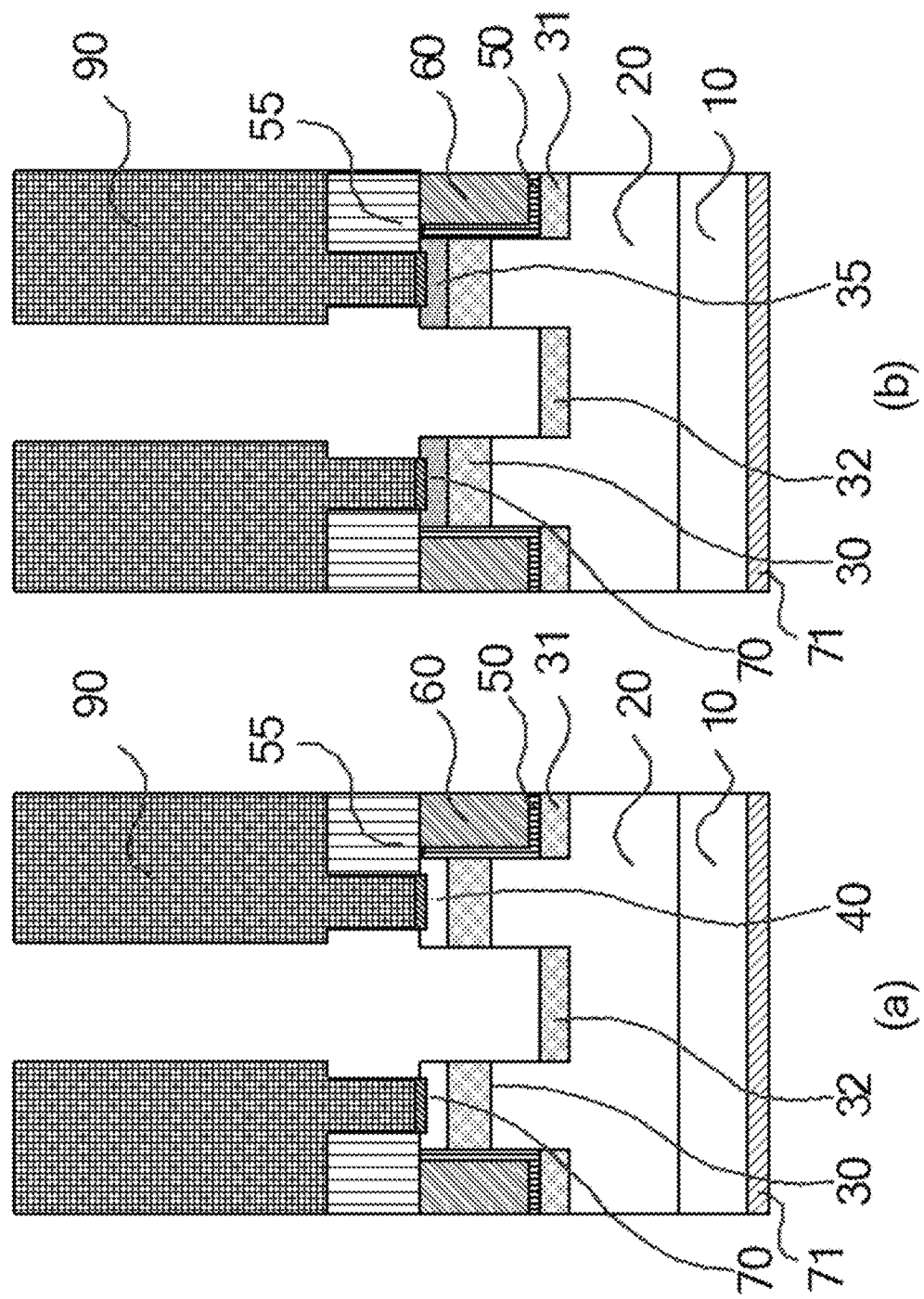
FIG. 22 is cross-sectional diagrams illustrating the fabrication method for the silicon carbide semiconductor device according to Embodiment 2.

Then, as shown in the cross-sectional diagrams of FIG. 22, the intermetal dielectric film 55 in the upper portion, and possibly the gate dielectric film 50, of the Schottky trench ST are wet etched using the etching solution containing the hydrofluoric acid. In this case, the intermetal dielectric film 55 in the upper portion, and possibly the gate dielectric film 50, of the Schottky trench ST are the films to be etched. The regions to be wet etched include the Schottky trench ST, the surface of the well region 30 and the contact region 35 both adjoining the inside of the Schottky trench ST.

Figure 23:
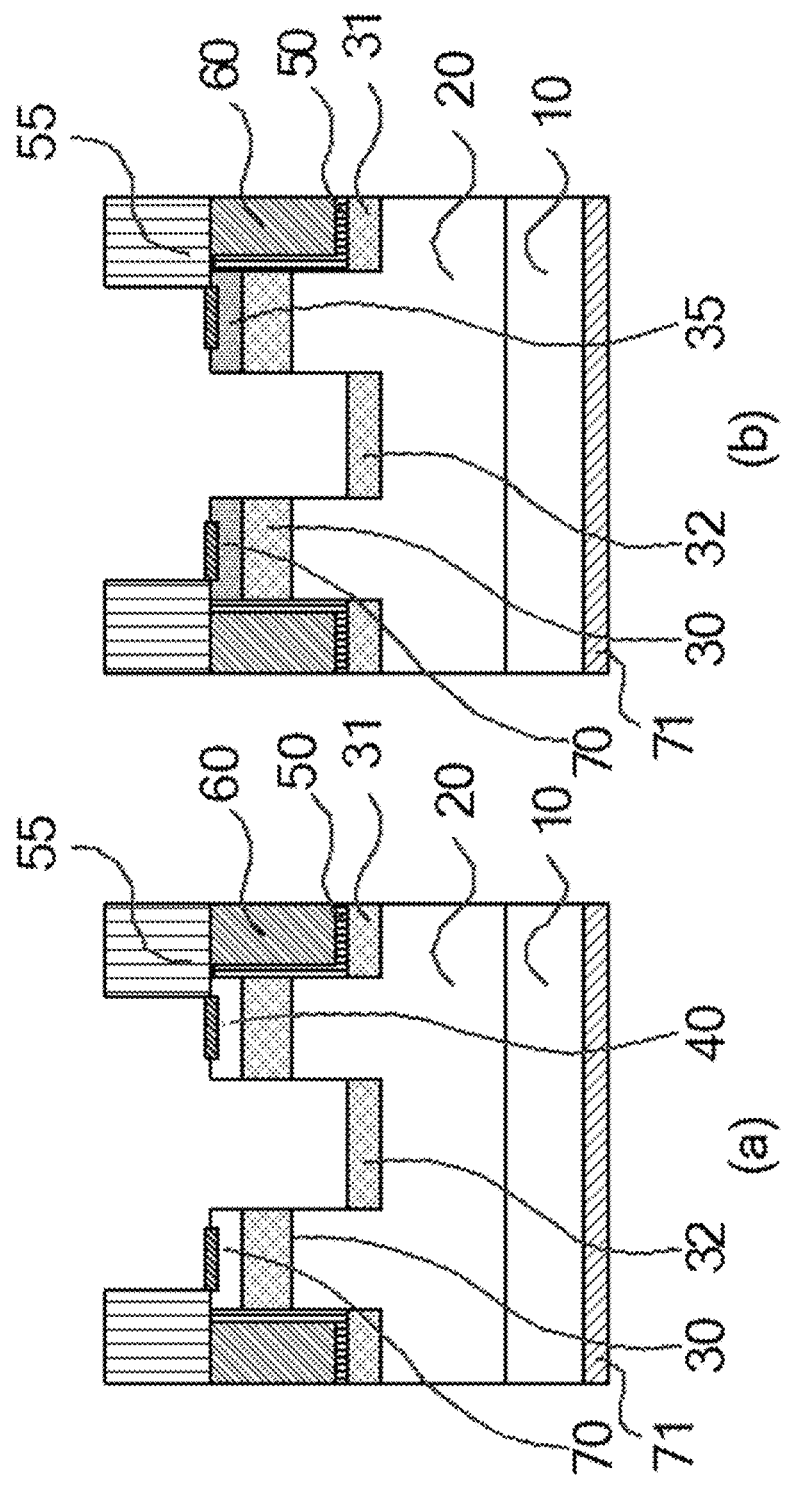
FIG. 23 is cross-sectional diagrams illustrating the fabrication method for the silicon carbide semiconductor device according to Embodiment 2.

Then, as shown in the cross-sectional diagrams of FIG. 23, the resist mask 90 is removed. Then, the source electrode 80, which makes a Schottky junction with the drift layer 20, is formed inside the Schottky trench ST, and the drain electrode 85, which is to be in contact with the backside ohmic electrode 71 existing on the back side, is formed. Thus, the SiC-MOSFET with a built-in SBD, shown in the cross-sectional diagrams of FIG. 14, is fabricated.

Also by the fabrication method for the SiC-MOSFET with a built-in SBD, which is a silicon carbide semiconductor device, according to the present embodiment, the resist mask 90 is formed on the ohmic electrode 70 after the oxidized layer 75 having formed on the surface of the ohmic electrode 70 is removed. Therefore, during the subsequent wet etching by the etching solution containing the hydrofluoric acid, the etching solution does not reach the vicinity of the gate electrode 60. This prevents fabrication of a product with failure.

Note that the gate trench GT and the Schottky trench ST may be etched separately to have their individual depths.

The well region 30 and the source region 40 may be formed by an epitaxial method instead of the ion implantation method.

Embodiment 3

In Embodiment 1, the ohmic electrode 70 is formed while the gate dielectric film 50 and the intermetal dielectric film 55 over the region including the surface of the first separation region 21 that is to be the Schottky junction surface are left, and then the gate dielectric film 50 and the intermetal dielectric film 55 over the surface of the first separation region 21 are wet etched. The present embodiment differs from Embodiment 1 in that the gate dielectric film 50 and the intermetal dielectric film 55 over the region including the surface of the first separation region 21 that is to be the Schottky junction surface and over the region where the ohmic electrode 70 is formed are removed at once together, and then the ohmic electrode 70 is formed with the surface of the first separation region 21 that is to be the Schottky junction surface protected by another passivation film. The other features are the same as in Embodiment 1, so detailed descriptions are omitted.

The silicon carbide semiconductor device fabricated by the fabrication method according to the present embodiment is the same as the SiC-MOSFET with a built-in SBD, shown in FIG. 1 to FIG. 3, fabricated by the fabrication method according to Embodiment 1.

Hereinafter, the fabrication method for the SiC-MOSFET with a built-in SBD, which is a silicon carbide semiconductor device according to Embodiment 3 of this disclosure, will be described with reference to the cross-sectional diagrams of FIG. 24 to FIG. 29.

Figure 24:
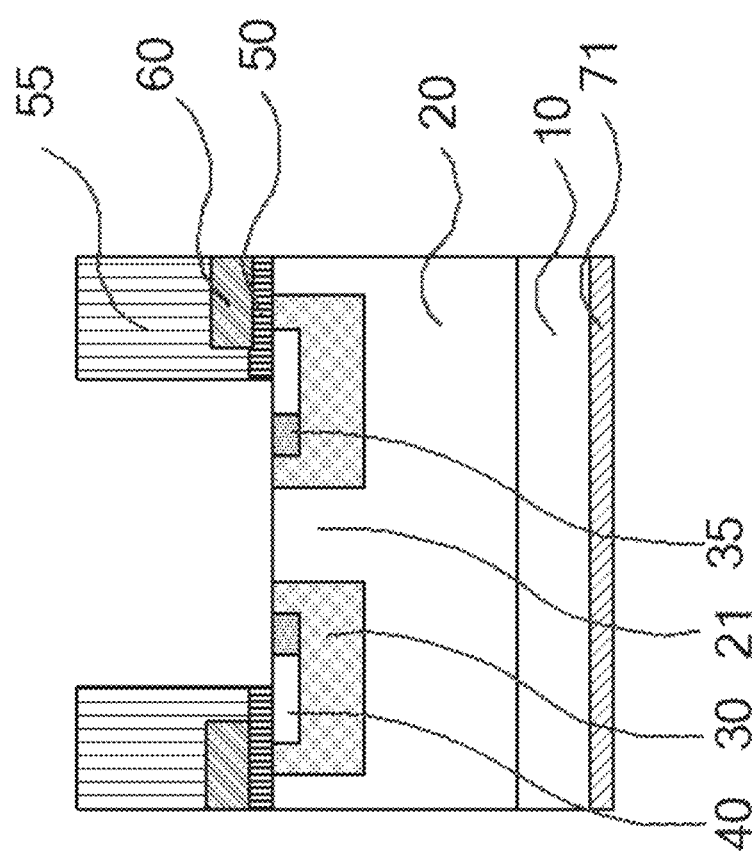
FIG. 24 is a cross-sectional diagram illustrating a fabrication method for a silicon carbide semiconductor device according to Embodiment 3.

FIG. 24 is a schematic cross-sectional diagram showing a structure in the middle stage of the fabrication process of the SiC-MOSFET with a built-in SBD according to Embodiment 1 of this disclosure shown in FIG. 1 to FIG. 3. FIG. 24 is a cross-sectional diagram at the stage where the contact hole is formed by the dry etching method after the step of FIG. 4 in Embodiment 1. The contact hole reaches the space on the first separation region 21, the well region 30, the contact region 35, and the source region 40 to penetrate the intermetal dielectric film 55 and the gate dielectric film 50.

Figure 25:
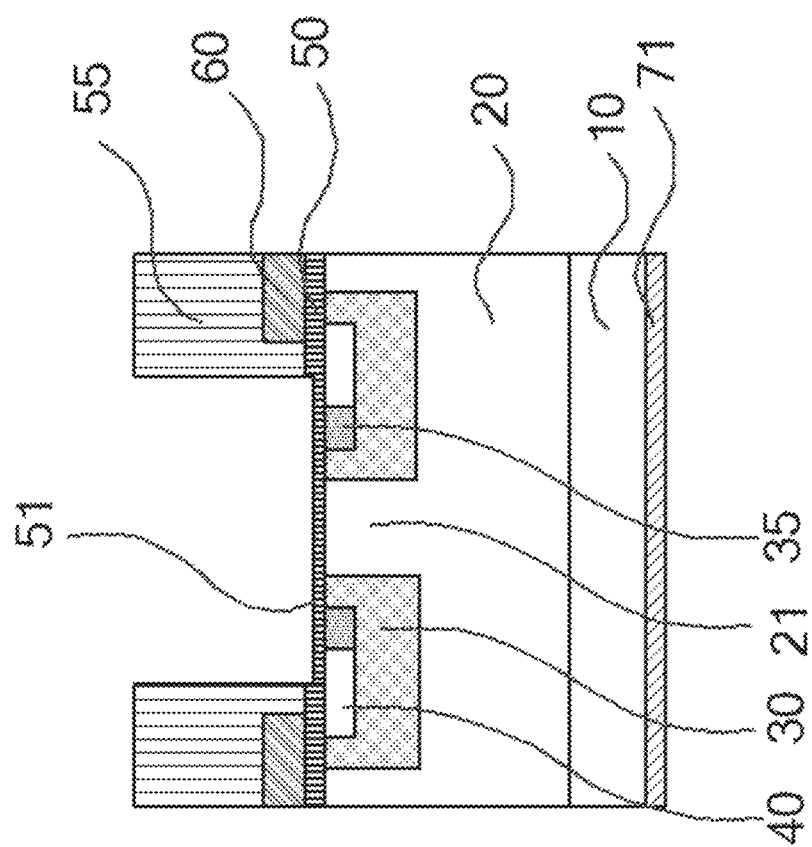
FIG. 25 is a cross-sectional diagram illustrating the fabrication method for the silicon carbide semiconductor device according to Embodiment 3.
Figure 26:
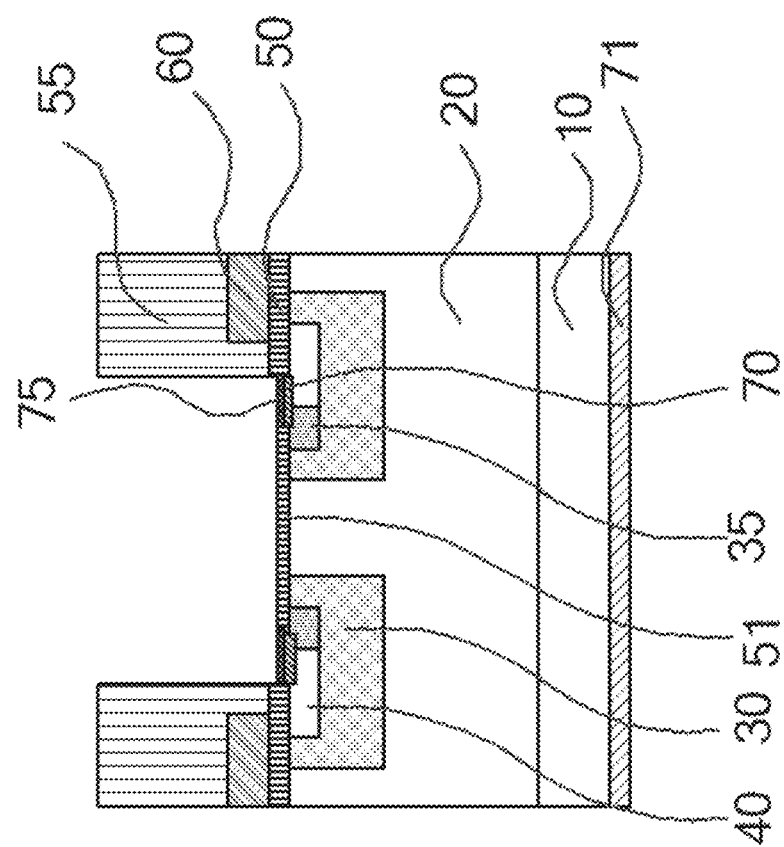
FIG. 26 is a cross-sectional diagram illustrating the fabrication method for the silicon carbide semiconductor device according to Embodiment 3.

Next, as shown in the cross-sectional diagram of FIG. 25, the inside of the contact hole is sacrificially oxidized. A sacrificial oxidized film 51 made of silicon oxide is formed on the sacrificial oxidized region. This sacrificial oxidation removes the damaged layer on the silicon carbide surface created by the dry etching and makes the properties of the SBD formed in this region more uniform. Next, as shown in the cross-sectional diagram of FIG. 26, of the sacrificial oxidized film 51 formed in the contact hole, the portion covering the contact region 35 and the source region 40 is removed to form, in the same place, the ohmic electrode 70 by the same method as used in Embodiment 1. At this time, the oxidized layer 75 is unexpectedly formed on the surface of the ohmic electrode 70.

Figure 27:
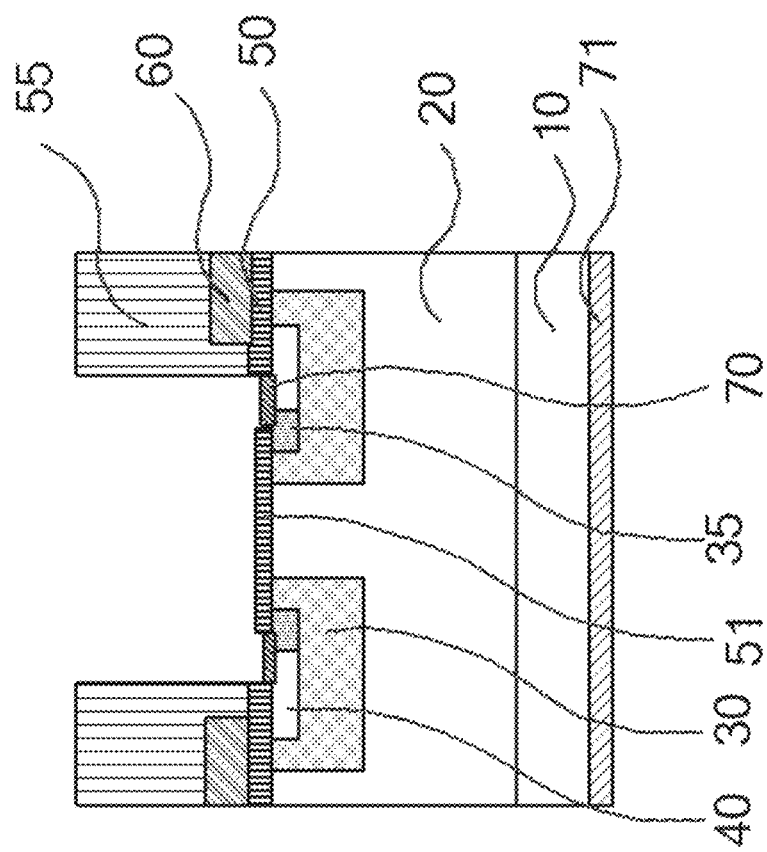
FIG. 27 is a cross-sectional diagram illustrating the fabrication method for the silicon carbide semiconductor device according to Embodiment 3.

Next, as shown in the cross-sectional diagram of FIG. 27, the oxidized layer 75 on the surface of the ohmic electrode 70 is removed by light etching with the hydrofluoric acid.

Figure 28:
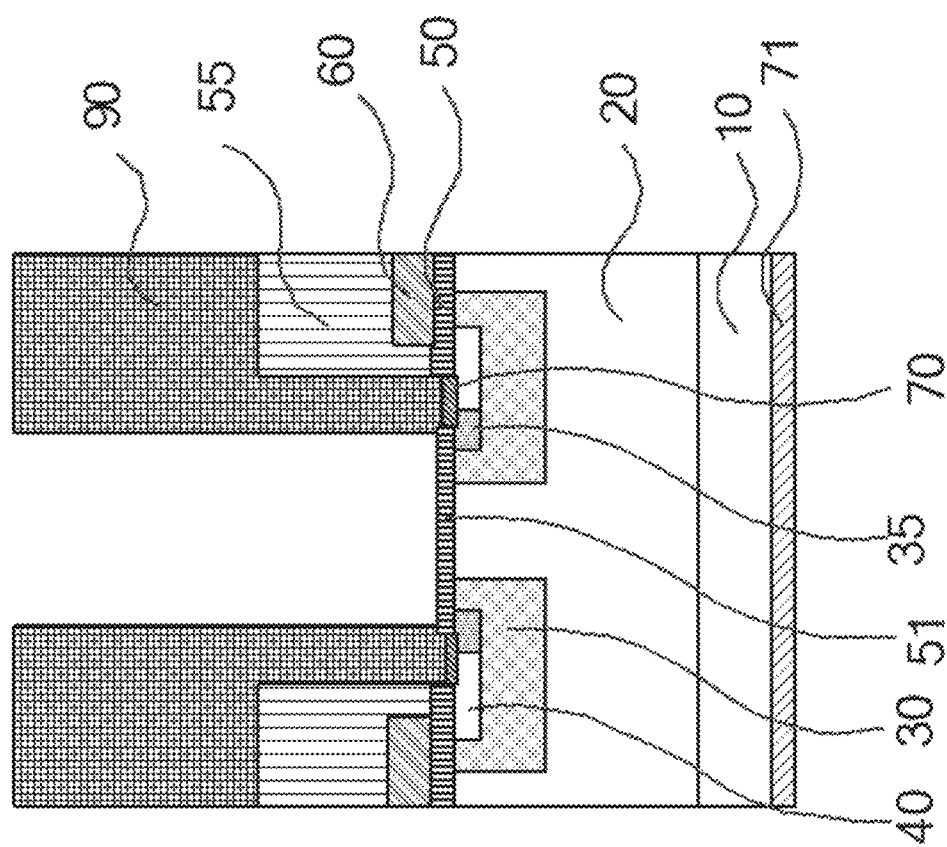
FIG. 28 is a cross-sectional diagram illustrating the fabrication method for the silicon carbide semiconductor device according to Embodiment 3.
Figure 29:
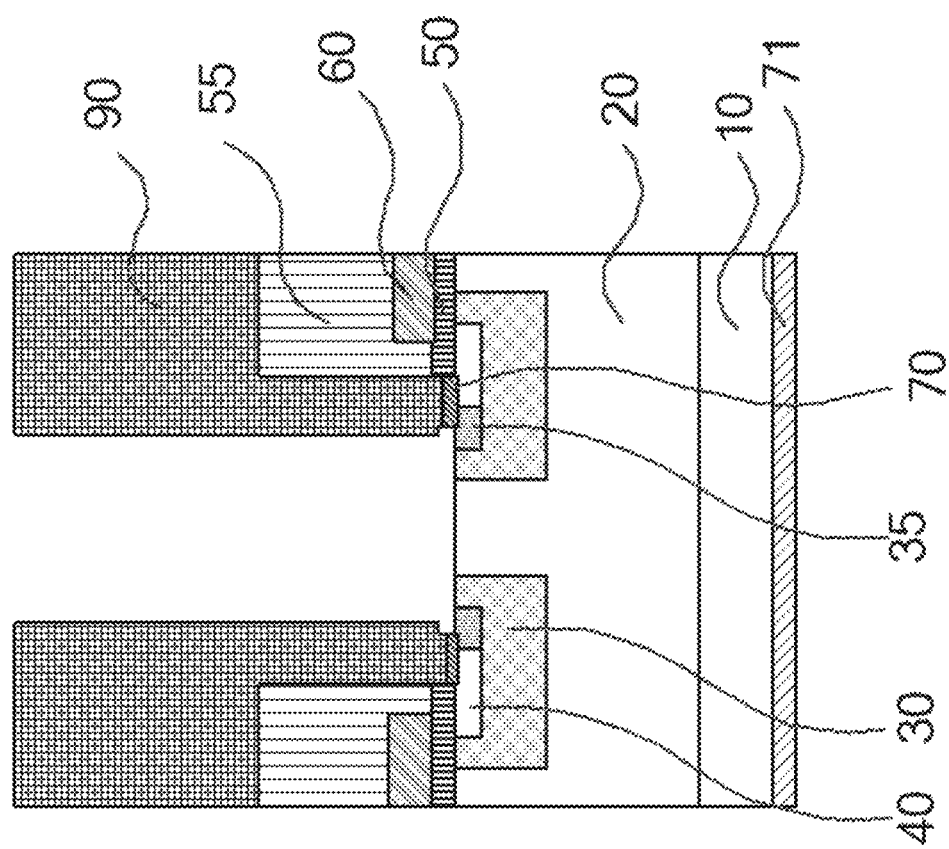
FIG. 29 is a cross-sectional diagram illustrating the fabrication method for the silicon carbide semiconductor device according to Embodiment 3.

Next, as shown in the cross-sectional diagram of FIG. 28, in order to etch the sacrificial oxidized film 51 on the region including the surface of the first separation region 21, the resist mask 90 is formed over the surfaces of the ohmic electrode 70 having the oxidized layer 75 removed and of the intermetal dielectric film 55 by the photolithography method, the mask having an opening on the side opposite to the side adjoining the dielectric film existing on the side in which the gate electrode 60 is formed. Then, as shown in the cross-sectional diagram of FIG. 29, the sacrificial oxidized film 51 on the region including the surface of the first separation region 21 is wet etched using the etching solution containing the hydrofluoric acid. In this case, the sacrificial oxidized film 51 is the film to be etched. The regions to be wet etched are regions including the surfaces of the first separation region 21, the well region 30 adjoining the first separation region 21, and the contact region 35.

Then, like the cross-sectional diagram of FIG. 9 in Embodiment 1, the resist mask 90 is removed. Then, the source electrode 80, which makes a Schottky junction with the first separation region 21, is formed on the first separation region 21 and its surrounding region, and the drain electrode 85, which is to be in contact with the backside ohmic electrode 71 existing on the back side, is formed. Thus, the SiC-MOSFET with a built-in SBD shown in FIG. 1 is fabricated.

In the fabrication method according to the present embodiment, the ohmic electrode 70 is formed with the sacrificial oxidized film 51 protecting the region including the surface that is to be the Schottky junction surface. However, the way of protection is not limited to that with the sacrificial oxidized film 51 but may be by a passivation film made of carbon or the like.

Also by the fabrication method for the SiC-MOSFET with a built-in SBD, which is a silicon carbide semiconductor device, according to the present embodiment, the resist mask 90 is formed on the ohmic electrode 70 after the oxidized layer 75 having formed on the surface of the ohmic electrode 70 is removed. Therefore, during the subsequent wet etching by the acid containing the hydrofluoric acid, the etching solution does not reach the vicinity of the gate electrode 60. This prevents fabrication of a product with failure.

In Embodiments 1 to 3, Al ions are used as p-type impurities, but the p-type impurity ions may be those of boron (B) or gallium (Ga). The n-type impurities may be ions of phosphorus (P) instead of N. In the MOSFETs according to Embodiments 1 to 3, the gate dielectric film is not limited to an oxidized film such as an $SiO_2$ film but may be a dielectric film other than an oxidized film, or may be a combination of a dielectric film other than an oxidized film and an oxidized film. Also, although oxidized silicon formed by the thermal oxidation of silicon carbide is used above for the gate dielectric film 50, silicon oxide of a deposited film formed by a CVD method may be used. The embodiments above are described using specific examples for crystal structures, orientations of main planes, off angles, and implantation conditions, etc. However, the values and conditions to be applied are not limit to the above-used values and conditions.

As for the mask, a resist mask formed by photoresist is exemplified. Instead, hard masks resistant to the hydrofluoric acid, such as those made of nitride compounds (silicon nitride, gallium nitride, aluminum nitride, etc.) or metals (tungsten, molybdenum, nickel, chrome, etc.) may also be used. Further, the mask may be a film made by lamination of layers of a hard mask and a photoresist mask, etc. These hard masks may be left in the silicon carbide semiconductor device without being removed.

The descriptions of embodiments above are about a MOSFET silicon carbide semiconductor device with a built-in SBD whose MOSFET is a so-called vertical MOSFET, which is a MOSFET that has a drain electrode formed on the back of the semiconductor substrate 10. However, the above embodiments can also be used for a MOSFET silicon carbide semiconductor device with a built-in SBD whose MOSFET is a so-called horizontal MOSFET, which has a drain electrode formed on the surface of the drift layer 20, such as a RESURF-type MOSFET. Moreover, the above embodiments can be used for a silicon carbide semiconductor device of an insulated gate bipolar transistor (IGBT) with a built-in SBD. Furthermore, the above embodiments can be applied for a device that is a MOSFET or an IGBT of a super junction structure with a built-in SBD.

Embodiment 4

The present embodiment is an application of the fabrication methods of the silicon carbide semiconductor device according to the above-described Embodiments 1 to 3 to the production of a power conversion device. Although this disclosure is not limited to the production method for a specific type of power conversion device, the case where this disclosure is applied to the production method for a three-phase inverter is described below as Embodiment 4.

Figure 30:
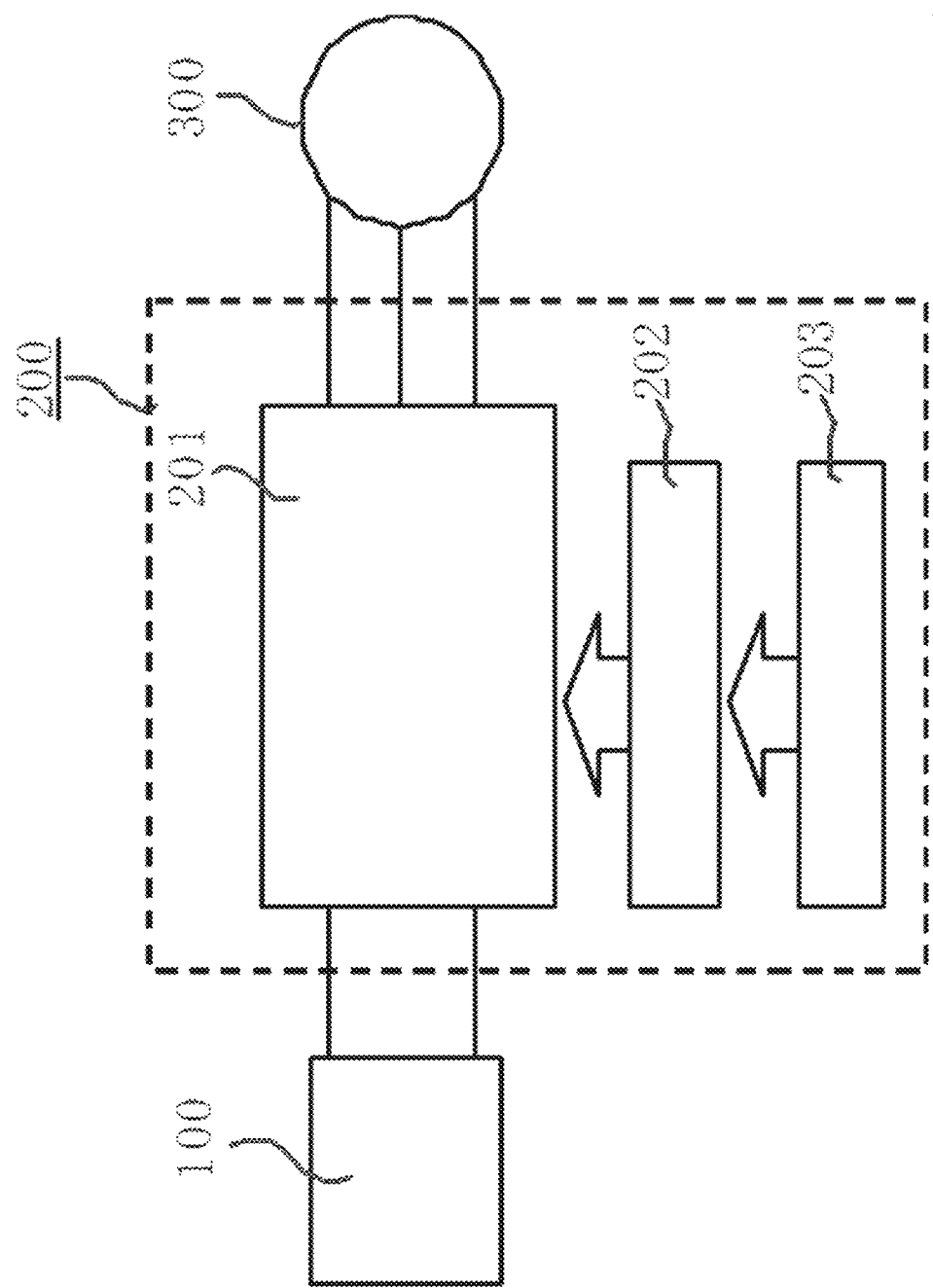
FIG. 30 is a schematic diagram of a configuration of a power conversion device produced by a production method according to Embodiment 4.

FIG. 30 is a block diagram showing a configuration of a power conversion system to which the power conversion device according to the present embodiment is applied.

The power conversion system shown in FIG. 30 includes a power supply 100, a power conversion device 200, and a load 300. The power supply 100 is a DC power supply to provide DC electricity to the power conversion device 200. The power source 100 may be any one of a variety of power sources, such as a DC power grid, solar cells, and storage batteries, or it may be a rectifier circuit or an AC/DC converter connected to the AC power grid. The power supply 100 may be a DC/DC converter that converts the DC electricity which is an output from a DC power grid to a required electricity.

The power conversion device 200 is a three-phase inverter connected between the power supply 100 and the load 300 to convert the DC electricity supplied from the power supply 100 to AC electricity and to supply the AC electricity to the load 300. As shown in FIG. 30, the power conversion device 200 includes a main conversion circuit 201 to convert DC electricity to AC electricity and output it, a drive circuit 202 to output a drive signal for driving switching devices of the main conversion circuit 201 and a control circuit 203 to output control signals for controlling the drive circuit 202 to the drive circuit 202.

The drive circuit 202 performs off-controls of normally-off type switching devices by making the voltages at the gate electrodes be equal to the voltages at the source electrodes.

The load 300 is a three-phase electric motor driven by the AC electricity supplied by the power conversion device 200. The load 300 is not limited to a specific-use motor but is an electric motor installed in various electric equipment. For example, it is an electric motor for a hybrid vehicle, an electric vehicle, a railway car, an elevator, or air conditioning system.

Hereinafter, the power conversion device 200 will be described in detail. The main conversion circuit 201 includes the switching devices (not shown). By the switching devices switching, the DC electricity supplied from the power supply 100 is converted to AC electricity to be supplied to the load 300. Although there is a variety of specific circuit configurations for the main conversion circuit 201, the main conversion circuit 201 according to the present embodiment is a two-level three-phase full-bridge circuit, which is composed of six switching devices and six freewheel diodes each connected in anti-parallel with its counterpart switching device. For each of the switching devices in the main conversion circuit 201, the silicon carbide semiconductor device fabricated by the fabrication method for the silicon carbide semiconductor device according to any one of Embodiments 1 to 3 above is used. Two switching devices out of the six switching devices are connected in series to form an upper and lower arm. Three pairs of upper-and-lower arms are for three phases (U-phase, V-phase, and W-phase) of the full bridge circuit. The output terminals from three upper-and-lower arms, that is, the three output terminals of the main conversion circuit 201, are connected to the load 300.

The drive circuit 202 generates drive signals to drive switching devices of the main conversion circuit 201 and provides them to the control electrodes of switching devices of the main conversion circuit 201. Specifically, in accordance with the control signals received from the control circuit 203 (described later), the drive circuit outputs to the control electrode of each switching device a drive signal that makes the switching device be in its ON state or a drive signal that makes the switching device be in its OFF state. When a switching device is to be kept in its ON state, a signal of voltage (ON signal) higher than the threshold voltage of the switching device should be provided thereto as the drive signal, whereas, when the switching device is to be kept in its OFF state, a signal of voltage (OFF signal) lower than the threshold voltage of the switching device should be provided thereto as the drive signal.

The control circuit 203 controls the switching devices of the main conversion circuit 201 so that the needed electricity may be supplied to the load 300. Specifically, the time duration (ON time) in which each switching device of the main conversion circuit 201 is required to be in its ON state is calculated on the basis of the electricity to be supplied to the load 300. The main conversion circuit 201 can be controlled, for example, by the PWM control in which the ON time of the switching device is modulated according to the voltage to be outputted. The control circuit 203 outputs the control commands (control signals) to the drive circuit 202 in such a way that, at each moment, an ON signal is outputted to a switching device that is required to be in its ON state and an OFF signal is outputted to a switching device that is required to be in its OFF state. In accordance with these control signals, the drive circuit 202 outputs an ON signal or an OFF signal as the drive signal to the control electrode of each of the switching devices.

In the production method for the power conversion device according to the present embodiment, the silicon carbide semiconductor devices fabricated by the fabrication method for the silicon carbide semiconductor device according to Embodiments 1 to 3 are used as the switching devices of the main conversion circuit 201. Therefore, the power conversion device of high-speed switching with low loss and improved reliability is realized.

In the present embodiment, an example in which this disclosure is applied to a two-level three-phase inverter is described, but this disclosure is not limited thereto and can be applied to various power conversion devices. Instead of the two-level power conversion device, this disclosure can be applied to a multilevel power conversion device with three or more levels. Further, this disclosure may be applied to a single-phase inverter in case the electricity is applied to a single-phase load. In addition, this disclosure can be applied to a DC/DC converter or an AC/DC converter in case the electricity is applied to a DC load or the like.

The application of the power conversion device according to this disclosure is not limited to the case where the load is an electric motor described above. For example, it can be used as a power supply device for an electric discharge machine, a laser processing machine, an induction heating cooker, and a non-contact power supply system, and it can further be used as a power conditioner for a photovoltaic power generation system or a power storage system.

DESCRIPTION OF THE SYMBOLS 10 semiconductor substrate,
20 drift layer,
21 first separation region,
22 second separation region,
30 well region,
35 contact region,
40 source region,
50 gate dielectric film,
51 sacrificial oxidized film,
55 intermetal dielectric film,
60 gate electrode,
70 ohmic electrode,
71 backside ohmic electrode,
75 oxidized layer,
80 source electrode,
85 drain electrode,
90 resist mask,
100 power supply,
200 power conversion device,
201 main conversion circuit,
202 drive circuit,
203 control circuit,
300 load,
GT Gate trench,
ST Schottky trench

The invention claimed is:

1. A fabrication method for a silicon carbide semiconductor device, the method comprising:
forming a dielectric film over part of a silicon carbide layer;
forming an ohmic electrode adjoining the dielectric film on the silicon carbide layer;
removing an oxidized layer on the ohmic electrode;
forming a mask with its opening on the side opposite to the side where the ohmic electrode is adjoining the dielectric film on the ohmic electrode having the oxidized layer removed and on the dielectric film;
wet etching of a film to be etched with hydrofluoric acid with the mask formed; and
removing the mask after the wet etching of the film.

2. The fabrication method for the silicon carbide semiconductor device according to claim 1, wherein the oxidized layer is removed by light etching with the hydrofluoric acid.

3. The fabrication method for the silicon carbide semiconductor device according to claim 1, wherein the ohmic electrode is made of silicide.

4. The fabrication method for the silicon carbide semiconductor device according to claim 2, wherein the ohmic electrode is made of silicide.

5. The fabrication method for the silicon carbide semiconductor device according to claim 3, wherein the silicide is nickel silicide.

6. The fabrication method for the silicon carbide semiconductor device according to claim 1, wherein the film to be etched is made of silicon oxide.

7. The fabrication method for the silicon carbide semiconductor device according to claim 2, wherein the film to be etched is made of silicon oxide.

8. The fabrication method for the silicon carbide semiconductor device according to claim 3, wherein the film to be etched is made of silicon oxide.

9. The fabrication method for the silicon carbide semiconductor device according to claim 1, wherein the dielectric film is made of silicon oxide.

10. The fabrication method for the silicon carbide semiconductor device according to claim 2, wherein the dielectric film is made of silicon oxide.

11. The fabrication method for the silicon carbide semiconductor device according to claim 3, wherein the dielectric film is made of silicon oxide.

12. The fabrication method for the silicon carbide semiconductor device according to claim 1, wherein a Schottky interface where the silicon carbide layer and a source electrode are joined together is formed on the surface of the silicon carbide layer where the film is removed by the wet etching.

13. The fabrication method for the silicon carbide semiconductor device according to claim 2, wherein a Schottky interface where the silicon carbide layer and a source electrode are joined together is formed on the surface of the silicon carbide layer where the film is removed by the wet etching.

14. The fabrication method for the silicon carbide semiconductor device according to claim 12, wherein the silicon carbide semiconductor device is a MOSFET with a built-in SBD and the dielectric film is an intermetal dielectric film formed bordering a gate electrode of the MOSFET.

15. The fabrication method for the silicon carbide semiconductor device according to claim 14, wherein the MOSFET with a built-in SBD is provided with the ohmic electrode and the Schottky interface in one contact hole formed so as to penetrate the intermetal dielectric film.

16. The fabrication method for the silicon carbide semiconductor device according to claim 15, wherein the Schottky interface is formed being surrounded by the ohmic electrode.

17. The fabrication method for the silicon carbide semiconductor device according to claim 14, wherein the MOSFET with a built-in SBD is provided with a trench-type MOSFET and an SBD formed in a trench.

18. The fabrication method for the silicon carbide semiconductor device according to claim 6, wherein the film to be etched is the same film as the dielectric film.

19. The fabrication method for the silicon carbide semiconductor device according to claim 6, wherein the film to be etched is a sacrificial oxidized film.

20. A power conversion device comprising:
a main conversion circuit including a silicon carbide semiconductor device fabricated by the fabrication method for the silicon carbide semiconductor device according to claim 15 to convert inputted electricity to output it;
a drive circuit to output a drive signal for a driving of the silicon carbide semiconductor device to the silicon carbide semiconductor device, the driving being performed by applying a gate electrode voltage for the silicon carbide semiconductor device lower than a threshold voltage so as to make the silicon carbide semiconductor device be in its OFF state; and a control circuit to output a control signal for controlling the drive circuit to the drive circuit.

\* \* \* \* \*